United States Patent
Jang et al.

(10) Patent No.: US 7,420,536 B2
(45) Date of Patent: Sep. 2, 2008

(54) ACTIVE MATRIX DISPLAY DEVICE

(75) Inventors: Yong Ho Jang, Gyeonggi-do (KR); Nam Wook Cho, Gyeonggi-do (KR); Soo Young Yoon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 643 days.

(21) Appl. No.: 10/964,968

(22) Filed: Oct. 15, 2004

(65) Prior Publication Data
US 2005/0156856 A1 Jul. 21, 2005

(30) Foreign Application Priority Data
Dec. 30, 2003 (KR) .................... 10-2003-0099481

(51) Int. Cl.
*G09G 3/36* (2006.01)
(52) U.S. Cl. ........................... 345/100; 377/64
(58) Field of Classification Search ............... 345/100, 345/93, 92, 82, 204, 18, 42; 377/54, 64; 327/333, 24, 94
See application file for complete search history.

(56) References Cited
U.S. PATENT DOCUMENTS

| | | | |
|---|---|---|---|
| 2002/0044625 A1* | 4/2002 | Kim et al. ..................... | 377/54 |
| 2003/0128180 A1* | 7/2003 | Kim et al. ..................... | 345/100 |
| 2003/0189542 A1* | 10/2003 | Lee et al. ..................... | 345/93 |
| 2003/0231735 A1* | 12/2003 | Moon et al. ..................... | 377/64 |
| 2004/0017878 A1* | 1/2004 | Sun .............................. | 377/64 |
| 2004/0028172 A1* | 2/2004 | Yu .............................. | 377/64 |
| 2004/0056852 A1* | 3/2004 | Shih et al. ..................... | 345/204 |
| 2004/0100318 A1* | 5/2004 | Lim ............................. | 327/333 |
| 2004/0109526 A1* | 6/2004 | Park et al. ..................... | 377/64 |
| 2004/0113878 A1* | 6/2004 | Park ............................. | 345/92 |
| 2004/0125069 A1* | 7/2004 | Park et al. ..................... | 345/100 |
| 2004/0239608 A1* | 12/2004 | Chung ........................ | 345/100 |
| 2006/0050032 A1* | 3/2006 | Gunner et al. ................ | 345/82 |

\* cited by examiner

*Primary Examiner*—Nguyen Chanh
*Assistant Examiner*—Adam J Snyder
(74) *Attorney, Agent, or Firm*—Morgan, Lewis & Bockius LLP

(57) ABSTRACT

An active matrix display device includes: a display panel; a gate driver; and a data driver, wherein the gate driver includes a plurality of shift registers to output signals that are sequentially shifted, each of the shift registers including: a first control part for controlling a first node in response to a first clock signal; a second control part for controlling second and third nodes in response to the start signal and a second clock signal; and an output part to selectively output one of a third clock signal and a first supply voltage in response to voltages of the first, second, and third nodes, whereby second and third supply voltages, which are different from each other, are switched for application at the second and third nodes.

35 Claims, 12 Drawing Sheets

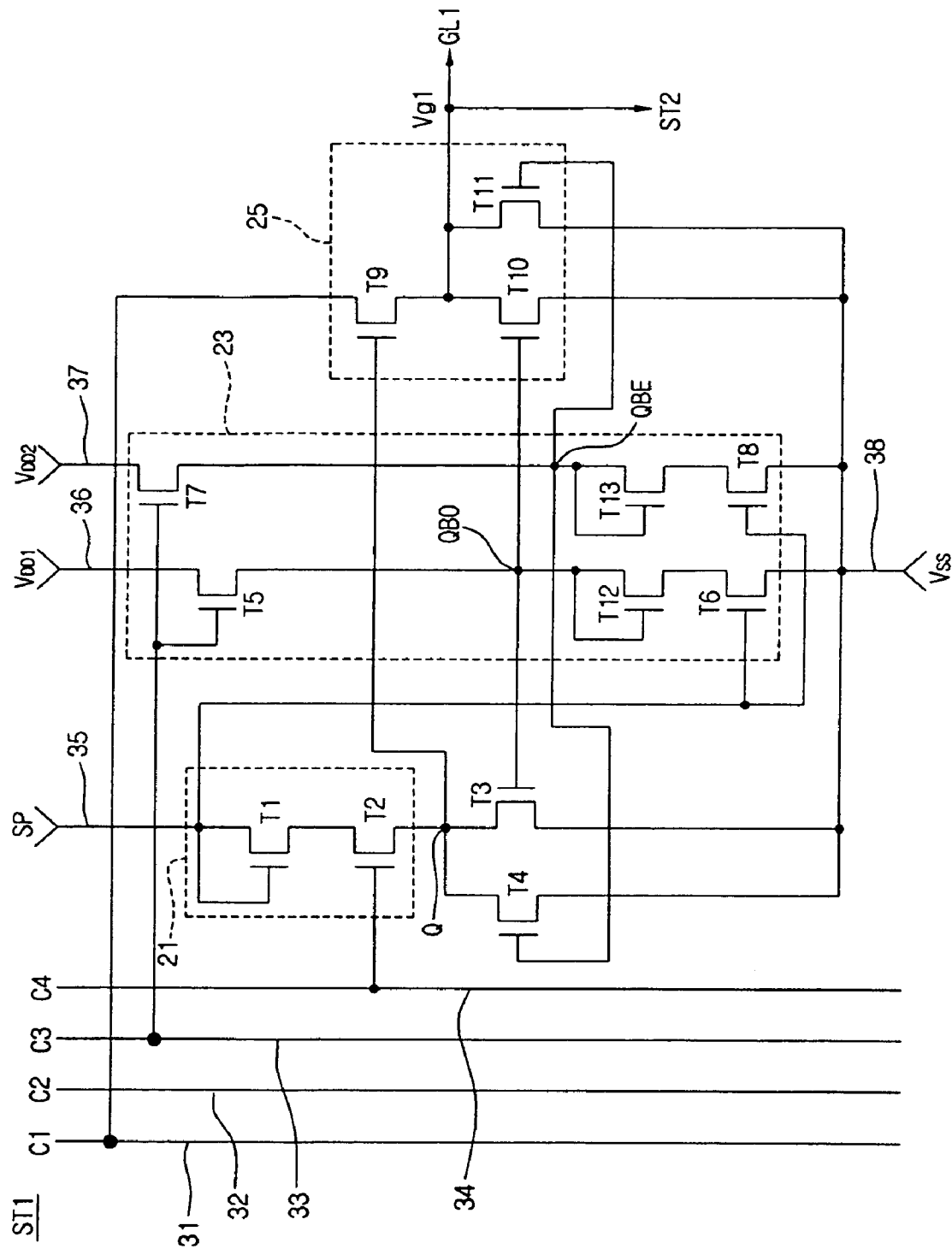

ACTIVE MATRIX DISPLAY DEVICE

The present invention claims the benefit of Korean Patent Application No. 2003-99481 filed in Korea on Dec. 30, 2003, which is hereby incorporated by reference.

BACKGROUND OF THE INVENTION

1. Field of the Invention

The present invention relates to an active matrix display device, and more particularly, to an active matrix display device capable of preventing degradation.

2. Description of the Related Art

In general, display devices, such as liquid crystal displays (LCDs) or organic light emitting diodes (OLEDs), that display images by driving pixels arranged in an active matrix configuration are actively researched. In particular, the LCD displays desired images by supplying data voltages corresponding to image information to pixels arranged in the active matrix configuration to adjust light transmittance through the liquid crystal layer. For this purpose, the LCD is provided with a liquid crystal panel having pixels arranged in a matrix configuration, and a driving circuit for driving the liquid crystal panel.

The liquid crystal panel includes a plurality of gate lines, a plurality of data lines perpendicularly crossing the gate lines, and pixel regions defined by the gate lines and the data lines. In each pixel region, a thin film transistor (TFT) and a pixel electrode connected with the TFT are provided. A gate of the TFT is connected with the gate line. A source of the TFT is connected with the data line and a drain of the TFT is connected with the pixel electrode.

The driving circuit includes a gate driver for sequentially supplying output signals (for example, gate signals) to the gate lines of the liquid crystal panel, and a data driver for supplying data voltages to the data lines of the liquid crystal panel. The gate driver sequentially supplies output signals to the gate lines such that pixels on one line are selected. The data driver supplies data voltages to the data lines such that the supplied data voltages are applied to the selected pixels. Thus, the LCD displays desired images by controlling light transmittance through the liquid crystal layer using an electric field depending on the data voltages applied to each pixel.

Recently, to lower the fabrication cost, a driver built-in LCD in which the gate driver and/or the data driver are/is built-in has been developed. In such a driver built-in LCD, the gate driver is fabricated concurrently with the liquid crystal panel while the liquid crystal panel is fabricated. Alternatively, the data driver may be built in the driver built-in LCD.

FIG. 1 is a block diagram of a gate driver according to the related art. The gate driver is provided with a plurality of shift registers for sequentially supplying output signals to each gate line, as shown in FIG. 1. The data driver may also be provided with a plurality of shift registers. FIG. 2 is a detailed circuit diagram of the shift register of FIG. 1. Although FIG. 2 shows only the first shift register representatively, the remaining shift registers ST2 to STn correspond to simple modification of the first shift register ST1, and accordingly will be sufficiently understood from a description of the construction for the first shift register ST1. FIG. 3 is a voltage waveform of the shift register shown in FIG. 1.

As further shown in FIG. 1, the gate driver includes a plurality of shift registers ST1 to STn coupled in cascade. The first shift register ST1 is coupled to a start pulse (SP) input line 5 and remaining shift registers ST2 to STn are connected to an output terminal of a previous shift register. All of the shift registers ST1 to STn are coupled to three input lines among the four clock signals C1 to C4. As shown in FIG. 3, the four clock signals C1 to C4 are supplied in such a manner that their phases are sequentially delayed to be immediately one after another. Each of the shift registers ST1 to STn shifts the start pulse SP by one clock pulse using three clock signals among the four clock signals C1 to C4 and then output the start pulse SP. Output signals Vg1 to Vgn respectively output from the shift registers ST1 to STn are sequentially supplied to corresponding gate lines GL1 to GLn and at the same time supplied as start pulses to the next shift register.

The gate driver includes the plurality of shift registers ST1 to STn respectively coupled to the gate lines GL1 to GLn. The shift registers ST1 to STn are, as shown in FIG. 2, coupled in cascade to shift the start pulse SP by one clock pulse, thereby sequentially supplying output signals to the gate lines GL1 to GLn. In detail, the start pulse SP is input into the first shift register ST1, and output signals Vg1 to Vgn−1 of the shift registers of a previous stage are input into the $2^{nd}$ shift register ST2 to the n-th shift register STn. These shift registers ST1 to STn receive three clock signals among the first to fourth clock signals C1 to C4 whose phases are sequentially delayed. The shift registers ST1 to STn shift the start pulse SP by one clock pulse using the input three clock signals such that the output signals Vg1 to Vgn are sequentially output.

Referring to FIG. 2, the first shift register ST1 includes a first control part 11 for controlling node Q according to the fourth clock signal C4, a second control part 13 for controlling node QB in response the third clock signal C3 or the start pulse SP, and an output part 15 that selects and outputs any one of the first clock signal C1 and a first supply voltage VSS selected by a voltage of node Q or a voltage of node QB. The first control part 11 controls the node Q such that the first clock signal C1 is output through a sixth transistor T6 of the output part 15 and is supplied as the first output signal Vg1 through the first gate line GL1. For this operation, the first control part 11 includes a first diode-connected transistor T1 coupled to the start pulse SP input line 5, and a second transistor T2 coupled to the first transistor T1, the fourth clock signal C4 and the node Q.

The second control part 13 controls the node QB such that the first supply voltage VSS is output through a seventh transistor T7 of the output part 15 and is then supplied as the first output signal Vg1 through the first gate line GL1. For this operation, the second control part 13 includes a fourth transistor T4 coupled to an input line 6 of a second supply voltage VDD, the input line 3 of the third clock signal C3, and the node QB, and a fifth transistor T5 coupled to the node QB, the start pulse SP input line 5, and an input line 7 of the first supply voltage VSS.

The output part 15 includes a sixth transistor T6 for selecting the first clock signal C1 in response to a voltage of the node Q and supplying the selected first clock signal C1 to the first gate line GL1, and a seventh transistor T7 for selecting the first supply voltage VSS in response a voltage of the node QB and supplying the selected supply voltage VSS to the first gate line GL1. The first control part 11 further includes a third transistor T3 coupled to the node Q, the node QB, and the input line 7 of the first supply voltage VSS, for controlling the node QB in a dual operation together with the seventh transistor T7.

In the first shift register ST1, the first to fourth clock signals C1 to C4, whose phases sequentially follow one after the other, are supplied, as shown in FIG. 3. The fourth clock signal C4 has a phase synchronized with the start pulse SP. The start pulse SP and the first to fourth clock signals C1 to C4 have a voltage swing in a range of −5V to 20V. In other words, the start pulse SP and the first to fourth clock signals C1 to C4 having a voltage of −5V are applied during a normal operation period while the start pulse SP and the first to fourth clock signals C1 to C4 having a voltage of 20V are applied for a pulse-on period. Hereinafter, the voltage of −5V is referred to as "low-state voltage" and the voltage of 20V is referred to as "high-state voltage". The first supply voltage VSS provides a low-state voltage of −5V, and the second supply voltage VDD provides a high-state voltage of 20V. The first and second supply voltages are always a constant DC voltage. The first period represents a period of the fourth clock signal C4, the second period second represents a period of the first clock signal C1, the third period represents a period of the second clock signal C2, and the fourth period represents a period of the third clock signal.

Operations of the first shift register ST1 will now be described with reference to the waveforms of FIG. 3. In the first period, when the start pulse SP and the fourth clock signal C4 become a high-state voltage at the same time, the first and second transistors T1 and T2 are turned on, so that a voltage of about 20V is applied to the node Q. As a result, the sixth transistor T6 whose gate is coupled to the node Q is slowly turned on. In addition, the fifth transistor T5 is turned on as a result of the start pulse SP at a high-state voltage, so that a low-state voltage of −5V is provided from the input line 7 of the first supply voltage VSS to the node QB. Accordingly, the third and seventh transistors T3 and T7 each of which gate is coupled to the node QB are turned off. As a result, the low-state voltage of the first clock signal C1, i.e., −5V is supplied to the gate line GL1 of the first shift register ST1 such that the gate line GL1 is at a low-state voltage.

In the second period, when the start pulse SP and the fourth clock signal C4 become a low-state voltage and the first clock signal C1 becomes a high-state voltage, a bootstrapping phenomenon occurs due to an inner capacitor Cgs formed between gate and source of the sixth transistor T6, so that the node Q charges is charged up to 40V and becomes a reliable high-state voltage. The bootstrapping phenomenon is possible because all of the first to third transistors T1 to T3 are turned off and the node Q is in a floating state. Accordingly, the sixth transistor T6 is certainly turned on and thus the high-state voltage of 20V of the first clock signal C1 is rapidly charged to the first gate line GL1, so that the first gate line GL1 is supplied to the high-state voltage of 20V.

In the third period, when the first clock signal C1 becomes a low-state voltage and the second clock signal C2 become a high-state voltage, the voltage of the node Q drops to about 20V and the low-state voltage of −5V of the first clock signal is charged in the first gate line GL1.

In the fourth period, when the third clock signal C3 become a high-state voltage, the fourth transistors T4 is turned on, so that the second supply voltage VDD of 20V is provided to the node QB and the third and seventh transistors T3 and T7 are turned on. Accordingly, the high-state voltage of 20V previously on the node Q is changed to −5V, and the low-state voltage of −5V supplied from the input line 7 of the first supply voltage VSS via the turned on seventh transistor T7 is provided to the first gate line GL1. This low-state voltage on the first gate GL1 is maintained until the start pulse SP and the fourth clock signal C4 are supplied in the next frame.

During the second period, a high-state voltage is output through the sixth transistor T6 as a result of the node Q going to 40V. At this time, the node QB is at the low-state voltage of −5V. During the fourth period, the node Q is maintained at the low-state voltage until the start pulse SP and the fourth clock signal C4 are supplied in the next frame, and a high-state voltage is supplied to the node QB. As a result, during most periods of one frame, the node QB is maintained at the high-state voltage. When the high-state voltage continues for a long time on the node QB, the performance of the seventh transistor T7, whose gate is coupled to the node QB, degrades. If the degradation of the seventh transistor T7 is serious, the seventh transistor T7 can be fatally damaged, so that the LCD may no longer be driven. Accordingly, a desired image may not be displayed on the screen of the LCD.

The second shift register ST2 has the same construction as the first shift register ST1. The second shift register ST2 operates like the first shift register ST1 but uses the output signal Vg1 at a high-state voltage of the first shift register ST1 and clock signals, which have their phases delayed by one clock pulse as compared to the clock signals used in the first shift register ST1. Accordingly, the second shift register ST2 outputs an output signal at a high-state voltage that is shifted by one clock pulse as compared with the first shift register ST1. The remaining shift registers ST3 to STn operate like the second shift register ST2. Accordingly, the output signals Vg3 to Vgn at a high-state voltage are sequentially output to the corresponding gate lines GL3 to GLn. In other words, the high-state voltage output signals Vg1 to Vgn are sequentially output by the shift registers ST1 to STn coupled to the respective gate lines GL1 to GLn during one frame. The above operation is repeatedly performed for each subsequent frame.

In the gate driver constructed as above, the output signals VG1 to Vgn at a high-state voltage are supplied to the corresponding gate lines GL1 to GLn during a very short period of 16.67 ms. During the rest time of one frame period, the output signals VG1 to Vgn supplied to the respective gate lines GL1 to GLn are at a low-state voltage. When output signals Vg1 to Vgn at a low-state voltage are supplied, the gate of the seventh transistor T7 is still at the reliable high-state voltage (i.e., the voltage of node QB). To maintain the gate lines GL1 to GLn at the low-state voltage during most time of each frame, it is required to maintain the gate of the seventh transistor T7 at the reliable high-state voltage. Accordingly, by continuously repeating the above operations, a stress voltage is accumulated in the seventh transistor T7, so that the performance of the seventh transistor T7 degrades. FIG. 4 is a graph illustrating a cumulative stress voltage of the shift register shown in FIG. 1. As shown in FIG. 4, stress voltage accumulates from each frame and increases.

In general, the LCD deployed for a display device is expected to display images on for at least a few tens of years. However, the continuous accumulation of the stress voltage causes the degradation of the seventh transistor T7, so that threshold voltage of the seventh transistor T7 varies and mobility decreases. The device performance can deteriorate so much that it becomes difficult to precisely control the operation of the seventh transistor T7. As a result, a desired image is not displayed on the LCD screen. Also, the degradation of the seventh transistor results in a shortening of the life span for the LCD.

SUMMARY OF THE INVENTION

Accordingly, the present invention is directed to an active matrix display device that substantially obviates one or more problems due to limitations and disadvantages of the related art.

An object of the present invention is to provide an active matrix display device capable of preventing degradation of a shift register to improve its life span and improve picture quality.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an active matrix display device includes: a display panel having gate lines and data lines defining pixels; a gate driver in the display panel to supply output signals to gate lines of the display panel; and a data driver to supply image signals to data lines of the display panel, wherein the gate driver includes a plurality of shift registers to output signals that are sequentially shifted, each of the shift registers including: a first control part for controlling a first node in response to a first clock signal among a plurality of clock signals; a second control part for controlling second and third nodes in response to the start signal and a second clock signal; and an output part to selectively output one of a third clock signal and a first supply voltage in response to voltages of the first, second, and third nodes, whereby second and third supply voltages, which are different from each other, are switched for application at the second and third nodes.

In another aspect, an active matrix display device includes: a display panel having gate lines and data lines defining pixels; a gate driver in the display panel to supply output signals to gate lines of the display panel; and a data driver to supply image signals to data lines of the display panel, wherein the gate driver includes a plurality of shift registers to output signals that are sequentially shifted, each of the shift registers including: a first control part for controlling a first node in response to at least a first clock signal among a plurality of clock signals; a second control part for controlling first and second supply voltages from a first voltage supply and a second voltage supply to a second node, respectively, and for controlling first and third supply voltages from a first voltage supply and a third voltage supply, respectively, to a third node in response to the start signal and a second clock signal; an output part to selectively output one of a third clock signal and a first supply voltage in response to the voltage of the first, second, and third nodes.

In another aspect, a gate driver has a plurality of shift registers to output signals that are sequentially shifted in response to a start signal, each of the shift registers including: a first control part for controlling a first node in response a first clock signal among a plurality of clock signals; a second control part for controlling second and third nodes in response the start signal and a second clock signal; and an output part to selectively output one of a third clock signal and a first supply voltage in response to voltages of the first, second, and third nodes, whereby second and third supply voltages, which are different from each other, are switched for application at the second and third nodes.

In another aspect, a method of operating a gate driver having a first control part for controlling a first node in response a first clock signal among a plurality of clock signals, a second control part for controlling second and third nodes in response the start signal and a second clock signal, and an output part to selectively output one of a third clock signal and a first supply voltage in response to voltages of the first, second, and third nodes includes: applying a second supply voltage to the second node; applying a third supply voltage to the third node; generating an output of one of the third clock signal and the first supply voltage in response to voltages of the first, second, and third nodes; and switching the second and third supply voltages, which are different from each other, to apply the second supply voltage to the third node and to apply the third supply voltage to the second node.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

FIG. 9 is a circuit diagram illustrating a shift register of a gate driver in an LCD according to a second embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 5:
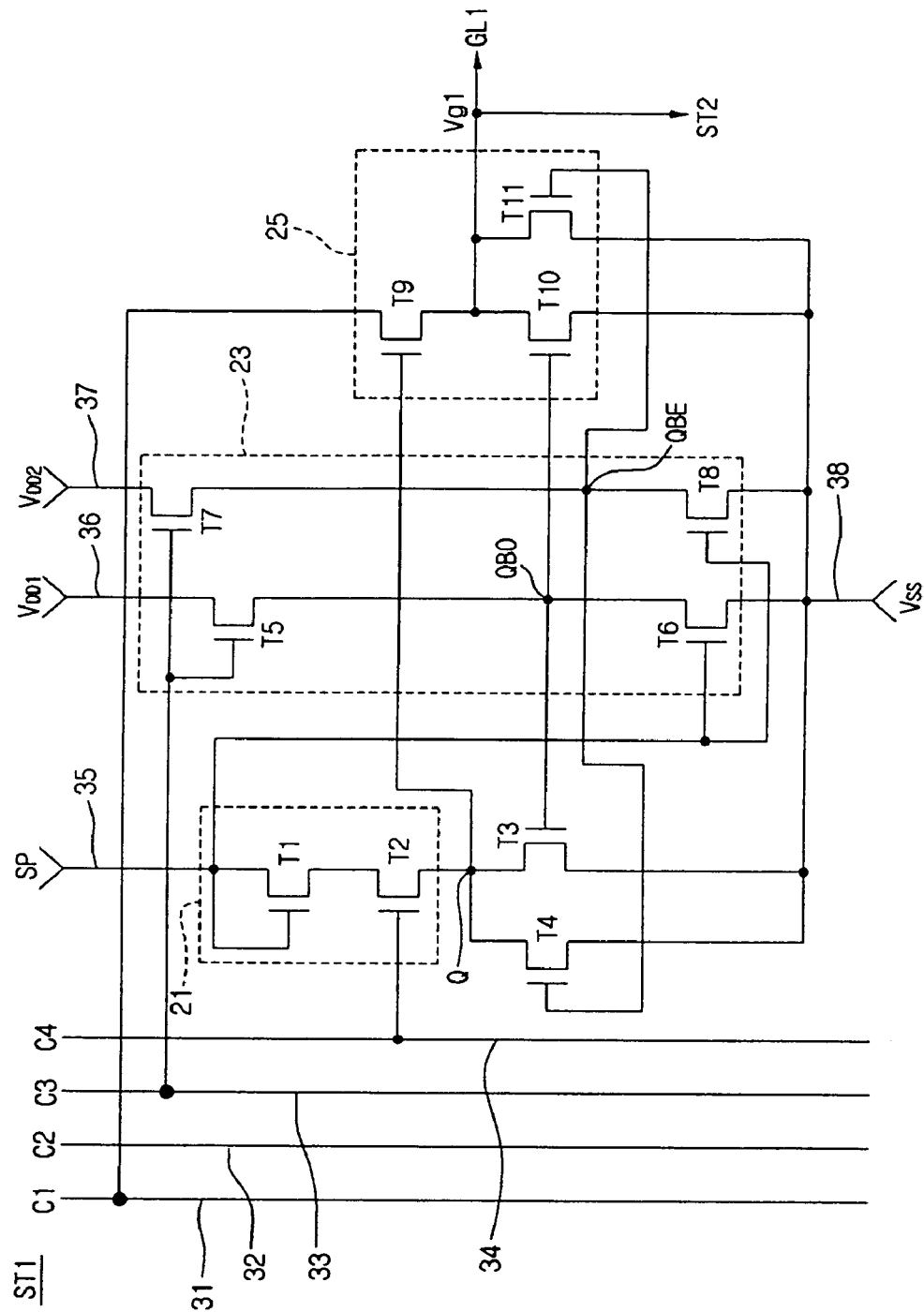
FIG. 5 is a circuit diagram illustrating a shift register of a gate driver in an LCD according to a first embodiment of the present invention.

FIG. 5 is a circuit diagram illustrating a shift register of a gate driver in an LCD according to a first embodiment of the present invention. A gate driver of an LCD includes a plurality of shift registers for supplying output signals Vg1 to Vgn in sequence. A description will be made with reference to a first shift register ST1 among the shift registers ST1 to STn. The remaining shifter registers ST2 to STn operate in a somewhat similar manner as the first shifter register ST1. A high-state voltage output signal Vg1 of the first shift register ST1 is supplied as a start pulse to the second shift register ST2, and a high-state voltage output signal Vg2 from the second shift register ST2 is supplied as a start pulse to the third shift register ST3. In the same manner, the remaining shift registers ST4 to STn receive high-state voltage output signals from previous stages as their start pulses and produce high-state voltage output signals whose phases are shifted so as to follow one after another.

Referring to FIG. 5, the first shift register ST1 includes a first control part 21 for controlling a node Q in response to a fourth clock signal C4, a second control part 23 for controlling nodes QBO and QBE in response to a third clock signal C3 or a start pulse SP, and an output part 25 for selectively outputting one of the first clock signal C1 and the first supply voltage VSS in response to a voltage of the node Q and voltages of the nodes QBO and QBE.

The first control part 21 controls the node Q to output the first clock signal C1 through a ninth transistor T9 of the output part 25. The first clock signal C1 is supplied as the output signal Vg1 at a high-state voltage through a first gate line GL1. The first control part 21 includes a first diode-connected transistor T1 and a second transistor T2. The first diode-connected transistor T1 is coupled to a start pulse (SP) input line 35. The second transistor T2 is coupled to the first diode-connected transistor T1, a fourth clock signal (C4) input line 34 and the node Q.

The second control part 23 controls the nodes QBO and QBE to output the first supply voltage VSS using a tenth or eleventh transistor T10 or T11 of the output part 25. The first supply voltage VSS is supplied as the output voltage Vg1 at a low-state voltage through the first gate line GL1. The second control part 23 includes: a fifth transistor T5 coupled to a second supply voltage (VDD1) input line 36, a third clock signal (C3) input line 33, and the node QBO; a sixth transistor T6 coupled to the node QBO, a start pulse (SP) input line 35, and a first supply voltage (VSS) input line 38; a seventh transistor T7 coupled to a third supply voltage (VDD2) input line 37, the third clock signal (C3) input line 33, and the node QBE; and an eighth transistor T8 coupled to the node QBE, the start pulse (SP) input line 35, and the first supply voltage (VSS) input line 38. When the fourth, first, and second clock signals C4, C1, and C2 become a high-state voltage, the nodes QBO and QBE are supplied with the first supply voltage VSS. Also, when the third clock signal C3 becomes a high-state voltage, the nodes QBO and QBE are supplied with second and third supply voltages VDD1 and VDD2 from first and second voltage supplies. The respective clock signals shown coupled to the respective transistors in FIG. 5 are merely exemplary for a single shift register.

Even when the respective clock signals are coupled to the respective transistors in a manner different than shown in FIG. 5, the nodes QBO and QBE can be charged as described above. Consequently, the nodes QBO and QBE can be charged with the first supply voltage VSS during three-phase clock signals among the clock signals C1 to C4, and the nodes QBO and QBE can be supplied with an opposite voltage during one clock signal. For example, VDD1 becomes a positive high-state voltage (20 V) and VDD2 becomes a negative idle voltage (−20 V). In a next frame, the inverse of the voltages, such as the same voltage value with a different polarity, can be applied. For example, VDD1 becomes the negative idle voltage (−20 V) and VDD2 becomes the positive high-state voltage (20 V).

The output part 25 includes: a ninth transistor T9 for selecting the first clock signal C1 in response to the voltage of the node Q and transferring it to the gate line GL1; and tenth and eleventh transistors T10 and T11 for selecting the first supply voltage VSS in response to the voltage of the node QBO or QBE and transferring it to the gate line GL1. As described above, since the opposite voltage is supplied to the nodes QBO and QBE, the tenth transistor T10 whose gate is coupled to the node (for example, the node QBO) charged with the positive high-state voltage is turned on, such that the first supply voltage VSS of a low-state voltage is supplied to the gate line GL1. Of course, the opposite case can also be possible.

The first control part 21 further includes: a third transistor T3 coupled to the node Q, the node QBO, and the first supply voltage (VSS) input line 38 for controlling the node QBO in a dual operation with the tenth transistor T10; and a fourth transistor T4 coupled to the node Q, the node QBE, and the first supply voltage (VSS) input line 38 for controlling the node QBE in a dual operation with the eleventh transistor T11. The second supply voltage VDD1 and the third supply voltage VDD2 are inverted in that they have opposite voltages (that is, the positive high-state voltage and the negative idle voltage) symmetrical with each other in a period. Although the above description is made about the case that the voltages are symmetrically opposite polarity voltages that are inverted after every frame, the voltages can be inverted every two or three frames. For example, in the case of a one-frame period, at an odd frame, the second supply voltage VDD1 is the positive high-state voltage of 20 V and the third supply voltage VDD2 is the negative idle voltage of −20 V. Meanwhile, in an even frame, the voltages are symmetrically inverted, such that the second supply voltage VDD1 is the negative idle voltage of −20 V and the third supply voltage VDD2 is the positive high-state voltage of 20 V.

The second supply voltage VDD1 and the third supply voltage VDD2 can be changed into voltages (for example, 20 V and −10 V) asymmetric within constant periods. For example, in the case of a one-frame period, in an odd frame, the second supply voltage VDD1 is the positive high-state voltage of 20 V and the third supply voltage VDD2 is the negative idle voltage of −10 V. Meanwhile, in an even frame, the voltages are asymmetrically inverted, such that the second supply voltage VDD1 is the negative idle voltage of −10 V and the third supply voltage VDD2 is the positive high-state voltage of 20 V. The negative idle voltage should be at least equal to or lower than the first supply voltage VSS.

The second and third supply voltages VDD1 and VDD2 can be the same positive high-state voltage of 20 V regardless of the period. If the second and third supply voltages VDD1 and VDD2 are the same positive high-state voltages, the same positive high-state voltage of 20 V is supplied to the nodes QBO and QBE when the third clock signal C3 becomes a higher high-state voltage. Such a higher high-state voltage is maintained until a start pulse of a next frame is supplied. Such an operation is repeated in each subsequent frame. In this case, the same higher high-state voltage is supplied to the nodes QBO and QBE. Thus, degradation occurring at the tenth and eleventh transistors T10 and T11 cannot be solved in this case. However, extension of the channel areas of the tenth and eleventh transistors can help prevent the degradation.

The second supply voltage VDD1 can have a constant DC voltage regardless of the period, and the third supply voltage VDD2 can have a constant DC voltage that is the invert of the second supply voltage VDD1 regardless of the period. Accordingly, since the voltages of the nodes QBO and QBE charged due to the second supply voltage VDD1 and the third supply voltage VDD2 have the symmetrical inverted voltages, if the positive high-state voltage is supplied to the gate of the tenth transistor T10 coupled to the node QBO, then the negative idle voltage is supplied to the gate of the eleventh transistor T11 coupled to the node QBE.

Also, the second supply voltage VDD1 and the third supply voltage VDD2 are periodically symmetrically inverted (that is, one frame, two frames, three frames, etc.). Thus, during the first period, the gate of the tenth transistor T10 has the positive high-state voltage and the gate of the eleventh transistor T11 has the negative idle voltage. During the second period, the gate of the tenth transistor T10 changed into the negative idle voltage and the gate of the eleventh transistor T11 changes into the positive high-state voltage.

Figure 6:
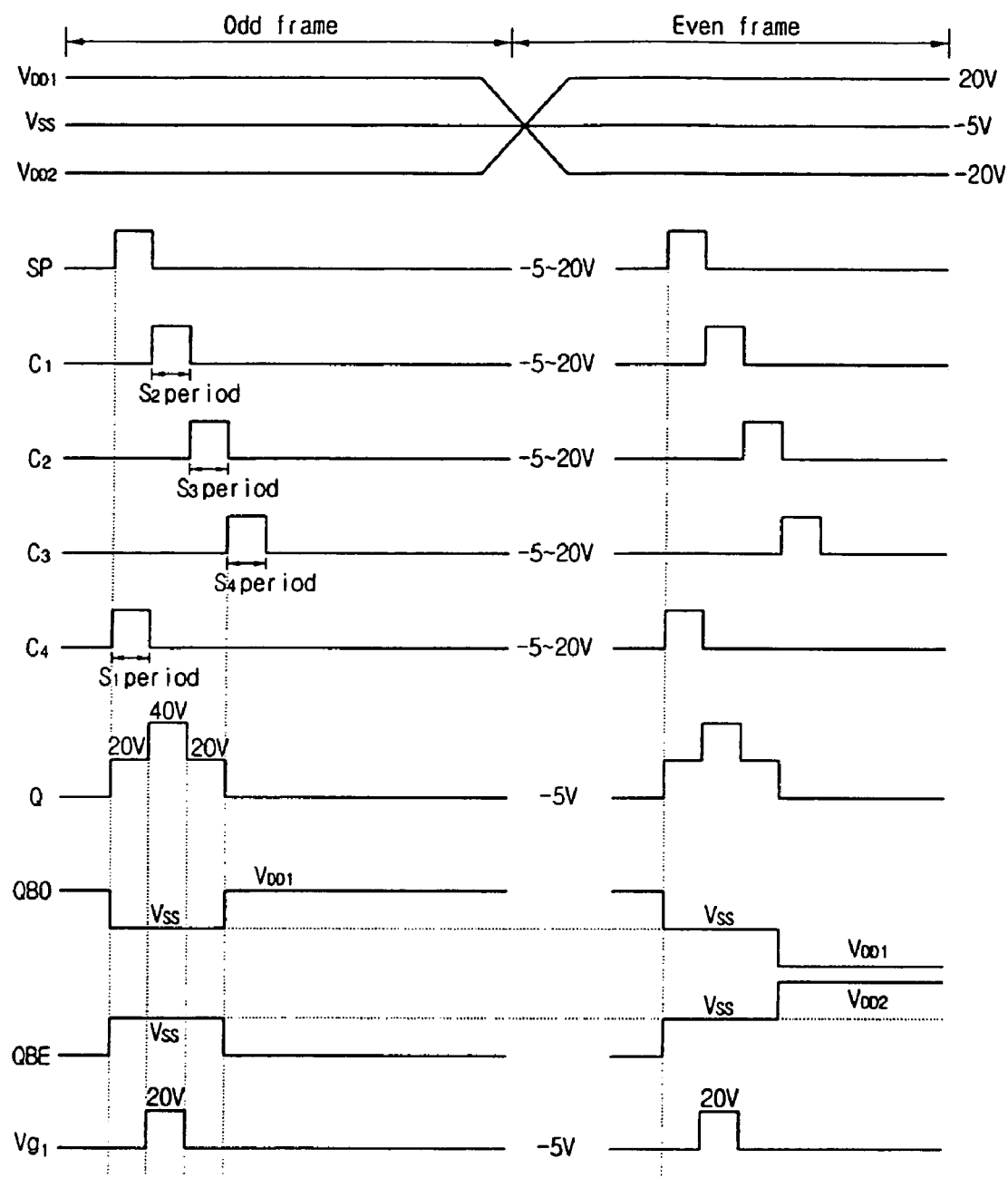
FIG. 6 is a voltage waveform of the shift register shown in FIG. 5.

Referring to FIG. 6, the first shift register ST1 configured as above supplies the first to fourth clock signals C1 to C4. Here, the fourth clock signal C4 has the same phase as the start pulse SP. The start pulse SP and the first to fourth clock signals C1 to C4 have a swing voltage ranging from −5 V to 20 V. That is, the voltages are −5 V in the normal state and changes to 20 V while the pulse is in an on state. While the first supply voltage VSS has the negative voltage of −5 V, the second supply voltage VDD1 and the third supply voltage VDD2 can have one of the positive high-state voltage of 20 V and the negative idle voltage of −20 V. The first period and the second period occur at the fourth clock signal (C4) period and the first clock signal (C1) period, respectively. Also, the third period and the fourth period occur at the second clock signal (C2) period and the third clock signal (C3) period, respectively.

FIG. 6 is a voltage waveform of the shift register shown in FIG. 5. Referring to FIG. 6, the second supply voltage VDD1 and the third supply voltage VDD2 are symmetrically inverted with respect to each other after every frame. That is, in an odd frame, the second supply voltage VDD1 has the positive high-state voltage of 20 V, while the third supply voltage VDD2 has the negative idle voltage of −20 V. On the contrary, in an even frame, the second supply voltage VDD1 has the negative idle voltage of −20 V, while the third supply voltage VDD2 has the positive high-state voltage of 20 V. Of course, the second supply voltage VDD1 and the third supply voltage VDD2 can also be changed every two frames, three frames, four frames and so on.

First, an operation in the odd frame will now be described. During the first period, if the start pulse SP and the fourth clock signal C4 become a high-state voltage at the same time, the first and second transistors T1 and T2 are turned on so that a voltage of about 20 V is applied at the node Q. Thus, the ninth transistor T9 whose gate is coupled to the node Q is slowly turned on. In addition, the sixth and eighth transistors T6 and T8 are turned on in response to the high-state voltage start pulse SP at the same time, so that the low-state voltage of −5 V supplied from the first supply voltage (VSS) input line 38 is supplied to the nodes QBO and QBE. Therefore, the third and tenth transistors T3 and T10, whose gates are coupled to the node QBO, and the fourth and eleventh transistors T4 and T11, whose gates are coupled to the node QBE, are all turned off. As a result, the low-state voltage (−5 V) of the first clock signal C1 is supplied to the first gate line GL1 through the turned-on ninth transistor T9.

During the second period, if the start pulse SP and the fourth clock signal C4 become a low-state voltage and the first clock signal C1 becomes a high-state voltage, bootstrapping occurs due to an internal capacitor Cgs between the gate and source of the ninth transistor T9. Thus, the node Q is charged to a voltage of 40 V, which is a higher high-state voltage. The bootstrapping can occur because the first to fourth transistors T1 to T4 are all turned off and the node Q is in a floating state. Accordingly, the ninth transistor T9 is completely turned on and the high-state voltage (20 V) of the first clock signal C1 is rapidly supplied to the first gate line GL1, so that the gate line is charged to the high-state voltage of 20 V.

During the third period, if the first clock signal C1 becomes a low-state voltage and the second clock signal C2 becomes a high-state voltage, the voltage at the node Q is again dropped to about 20 V and the low-state voltage of the first clock signal C1 is supplied at the gate line GL1 through the turned-on ninth transistor T9.

During the fourth period, if the third clock signal C3 becomes a high-state voltage, the fifth and seventh transistors T5 and T7 are turned on at the same time. Thus, the high-state voltage (20 V) supplied from the second supply voltage (VDD1) input line 36 is applied to the node QBO and the idle voltage (−20 V) supplied from the third supply voltage (VDD2) input line 37 is applied to the node QBE. Accordingly, the third and tenth transistors T3 and T10 whose gates are coupled to the node QBO are turned on. Meanwhile, the fourth and eleventh transistors T4 and T11 whose gates are coupled to the node QBE are kept in the turned-off state. About 20 V supplied to the node Q due to the turned-on third transistor T3 changes to the low-state voltage (−5 V) supplied from the first supply voltage (VSS) input line 38, and the low-state voltage (−5 V) supplied from the first supply voltage (VSS) input line 38 due to the turned-on tenth transistor T10 is supplied to the first gate line GL1 and is then output.

During a period when the start pulse is supplied in the even frame after the high-state voltage output signal is output to the first gate line GL1 at the odd frame due to the control of the node Q, the high-state voltage of 20 V is maintained at the node QBO and the idle voltage of −20 V is maintained at the node QBE. In the same manner, in the case of the remaining shift registers ST2 to STn coupled to the first shift register ST1 in cascade, during a period when the start pulse (that is, the output signal of the previous shift register) is supplied in the even frame after the high-state voltage output signal is output to the corresponding gate lines GL2 to GLn of the remaining shift registers ST2 to STn in the odd frame due to the control of the node Q, the high-state voltage of 20 V is maintained at the node QBO and the idle voltage of −20 V is maintained at the node QBE. After the output signals are sequentially output from the respective shift registers ST1 to STn, the operation is again performed from the first shift register ST1 in the next frame, that is, the even frame.

The second and third supply voltages VDD1 and VDD2 of the even frame are symmetrical inverted to use the same voltages of the odd frame. That is, the second supply voltage VDD1 of the even frame is inverted to the voltage of 20 V to −20 V, and the third supply voltage VDD2 is inverted to the voltage of −20 V to 20 V.

An operation at the even frame will now be described after the second and third supply voltages VDD1 and VDD2 of the even frame have been symmetrical. During the first period, if the start pulse SP and the fourth clock signal C4 become a high-state voltage at the same time, the first and second transistors T1 and T2 are turned on so that a voltage of about 20 V is applied to the node Q. Thus, the ninth transistor T9 whose gate is coupled to the node Q is slowly turned on. In addition, the sixth and eighth transistors T6 and T8 are turned on in response to the high-state voltage start pulse SP at the same time, so that the low-state voltage (−5 V) supplied from the first supply voltage (VSS) input line 38 is applied to the nodes QBO and QBE. At this time, the node QBO is maintained at the high-state voltage (20 V), which is supplied to the odd frame before the low-state voltage is applied. Also, the node QBE is maintained at the idle voltage (−20 V), which is supplied to the odd frame. In this case, the start pulse becomes a high-state voltage at the even frame, so that the first supply voltage VSS at the low-state voltage is applied to both nodes QBO and QBE. Therefore, the third and tenth transistors T3 and T10, whose gates are coupled to the node QBO, and the fourth and eleventh transistors T4 and T11, whose gates are coupled to the node QBE, are all turned off. As a result, the low-state voltage (−5 V) of the first clock signal C1 is applied to the first gate line GL1 through the turned-on ninth transistor T9.

During the second period, if the start pulse SP and the fourth clock signal C4 become a low-state voltage and the first clock signal C1 becomes a high-state voltage, bootstrapping occurs due an internal capacitor Cgs formed between the gate and source of the ninth transistor T9. Thus, the node Q is charged to a voltage of 40 V, which is a higher high-state voltage. The bootstrapping can occur because the first to fourth transistors T1 to T4 are all turned off and the node Q is in a floating state. Accordingly, the ninth transistor T9 is completely turned on and the high-state voltage (20 V) of the first clock signal C1 rapidly charges the first gate line GL1, so that the gate line is charged to the high-state voltage of 20 V.

During the third period, if the first clock signal C1 becomes a low-state voltage and the second clock signal C2 becomes a high-state voltage, the voltage at the node Q is again drops to about 20 V and the low-state voltage of the first clock signal C1 is supplied to the gate line GL1 through the turned-on ninth transistor T9.

During the fourth period, if the third clock signal C3 becomes a high-state voltage, the fifth and seventh transistors T5 and T7 are turned on at the same time. Thus, the idle voltage (−20 V) supplied from the second supply voltage (VDD1) input line 36 is applied to the node QBO and the high-state voltage (20 V) supplied from the third supply voltage (VDD2) input line 37 is applied to the node QBE. Accordingly, the third and tenth transistors T3 and T10 whose gates are coupled to the node QBO are turned-off. Meanwhile, the fourth and eleventh transistors T4 and T11 whose gates are coupled to the node QBE are turned on. About 20 V supplied to the node Q due to the turned-on fourth transistor T4 changes to the low-state voltage (−5 V) supplied from the first supply voltage (VSS) input line 38, and the low-state voltage (−5 V) supplied from the first supply voltage (VSS) input line 38 due to the turned-on eleventh transistor T11 is applied to the first gate line GL1 and is then output.

During a period when the start pulse is supplied in the even frame after the high-state voltage output signal is output to the first gate line GL1 in the odd frame due to the control of the node Q, the idle voltage of −20 V is maintained at the node QBO and the high-state voltage of 20 V is maintained at the node QBE. This is contrary to the odd frame, which will be described later.

In the above-described odd frame, the high-state voltage of 20 V is maintained at the node QBO and the idle voltage of −20 V is maintained at the node QBE. This is possible because the second and third supply voltages VDD1 and VDD2 are inverted symmetrically after a predetermined number of frames, such as one. In the same manner, in the case of the remaining shift registers ST2 to STn coupled to the first shift register ST1 in cascade, during a period when the start pulse (that is, the output signal of the previous shift register) is supplied in the even frame after the high-state voltage output signal is output to the corresponding gate lines GL2 to GLn of the remaining shift registers ST2 to STn at the odd frame due to the control of the node Q, the idle voltage of −20 V is maintained at the node QBO and the high-state voltage of 20 V is maintained at the node QBE.

As can be seen from the above operations, the high-state voltage of 20 V and the idle voltage of −20 V are respectively supplied to the nodes QBO and QBE in a next odd frame. Also, the idle voltage of −20 V and the high-state voltage of 20 V are respectively supplied to the nodes QBO and QBE in a next even frame.

Figure 1:
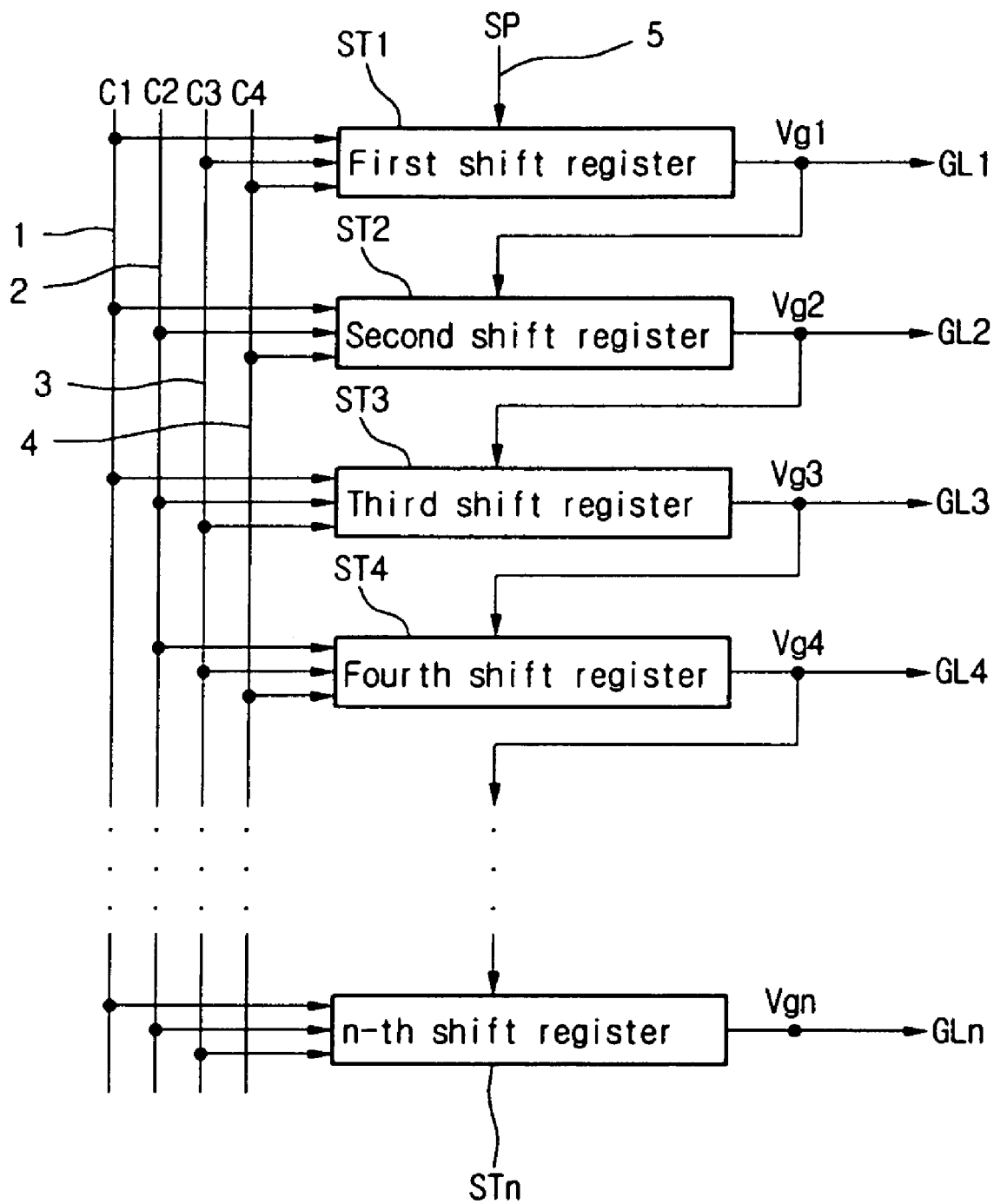
FIG. 1 is a block diagram of a gate driver of a related art LCD.
Figure 2:
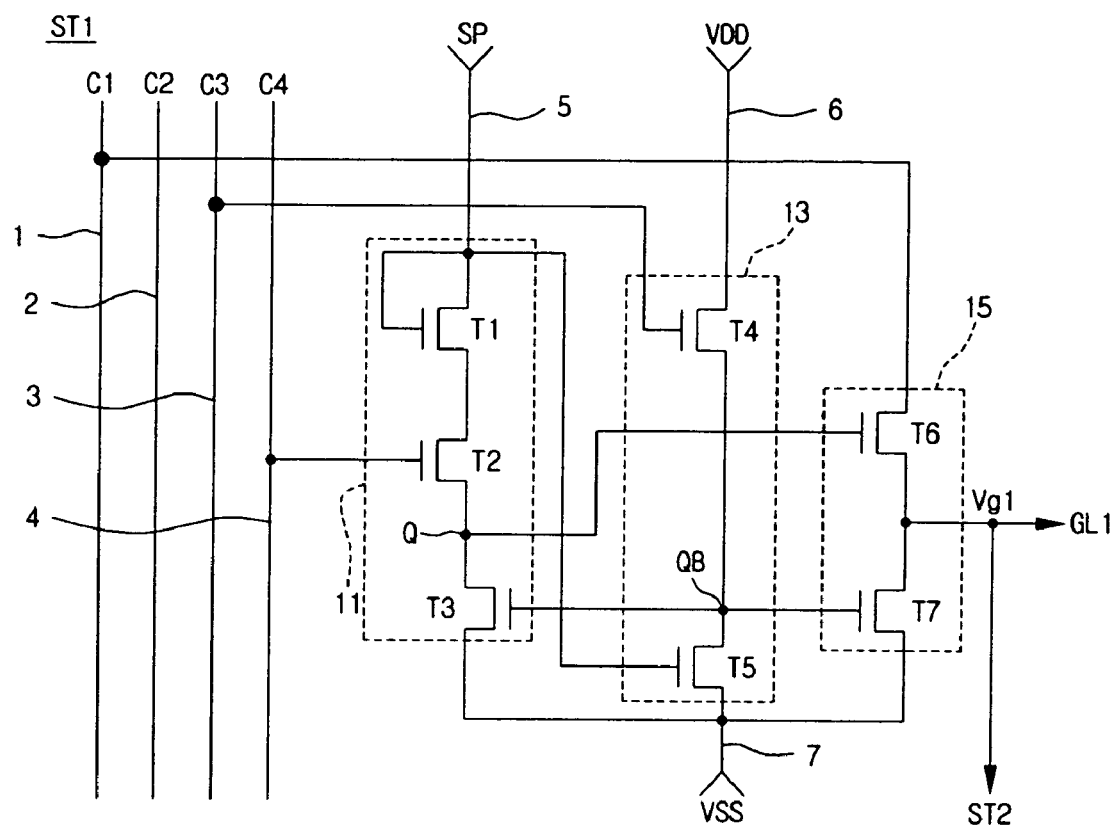
FIG. 2 is a circuit diagram of the shift register shown in FIG. 1.
Figure 3:
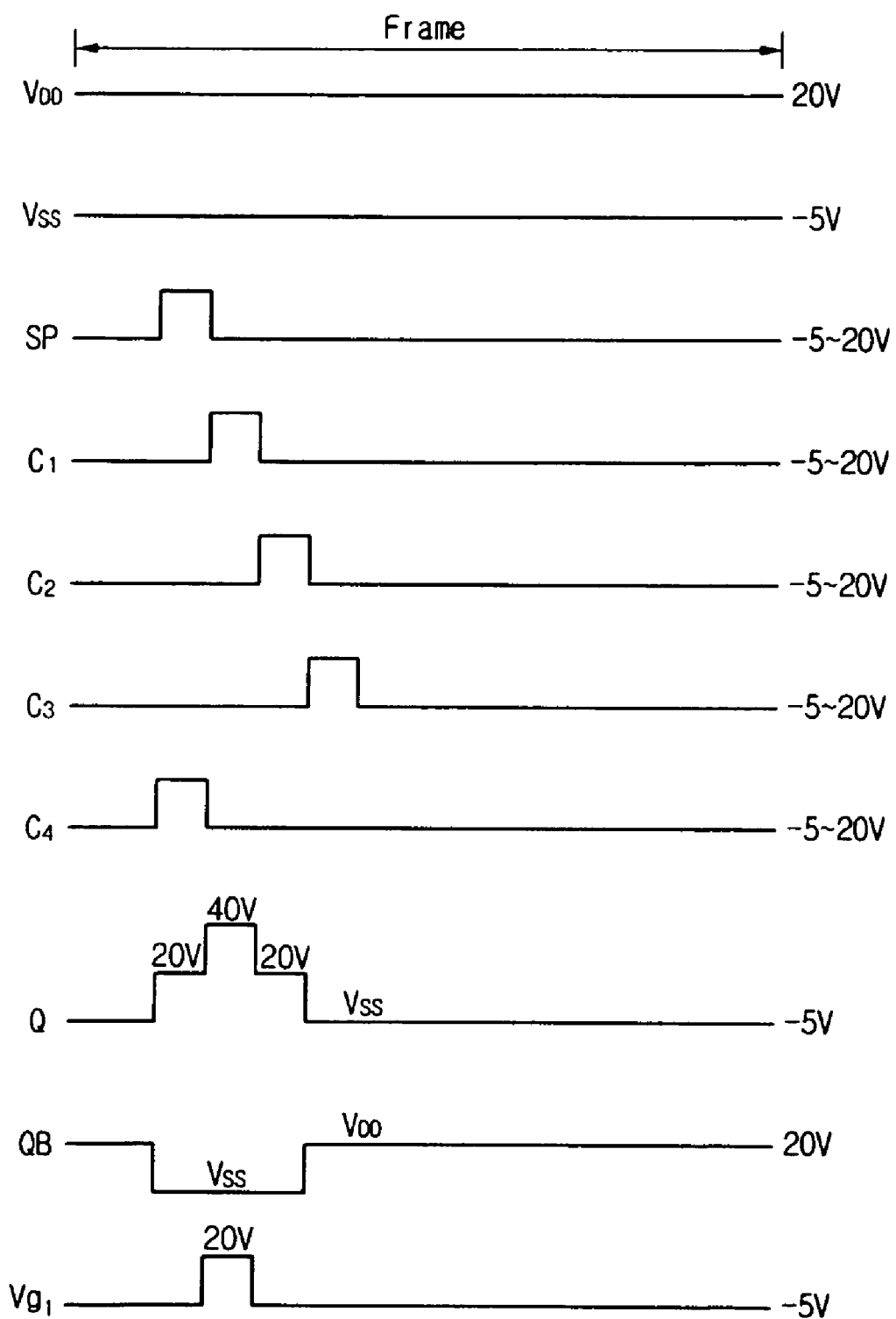
FIG. 3 is a voltage waveform of the shift register shown in FIG. 1.
Figure 4:
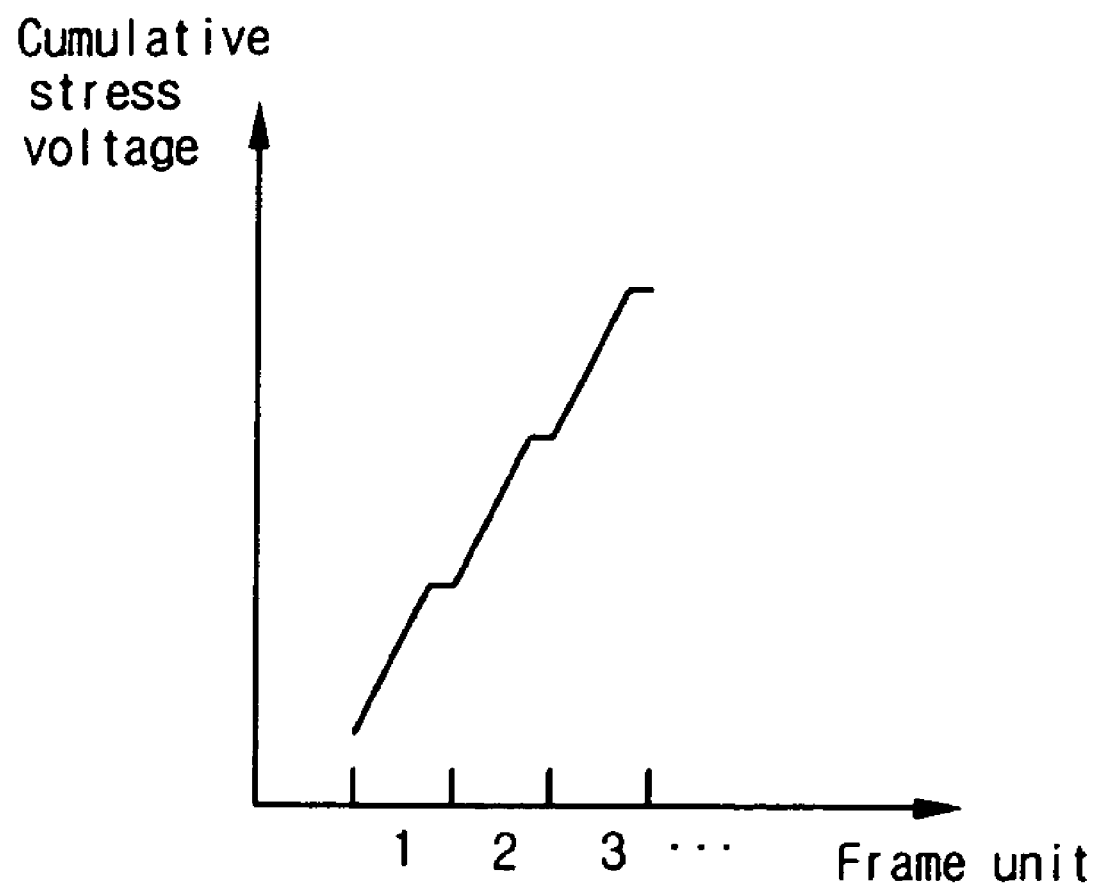
FIG. 4 is a graph illustrating a cumulative stress voltage of the shift register shown in FIG. 1.

According to the related art, degradation of the shift register occurs because one transistor (T7, in FIG. 2) is coupled to the node QB so that the node QB is charged to a high-state voltage of 20 V during most periods of every frame. However, according to embodiments of the present invention, the inverted voltages are supplied to the nodes QBO and QBE in turn at every frame. That is, the high-state voltage and the idle voltage are changed periodically, thereby preventing the stress voltage from being accumulated. Therefore, the degradation can be prevented. Consequently, the tenth and eleventh transistors T10 and T11 coupled to the nodes QBO and QBE can operate stably, thereby improving picture quality and extending life span.

Figure 7A:
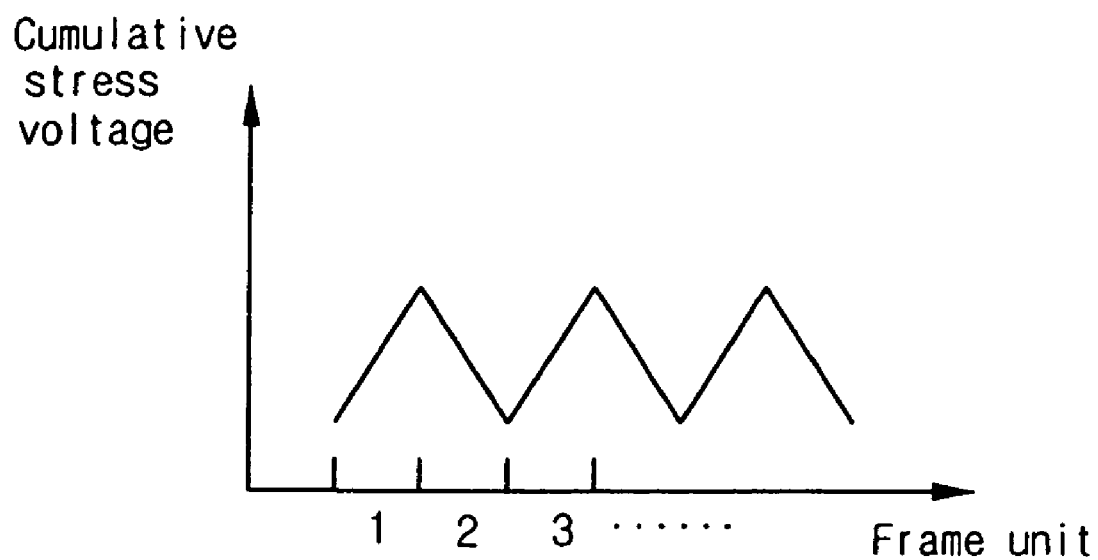
FIGS. 7A and 7B are graphs illustrating a cumulative stress voltage of the shift register shown in FIG. 5.
Figure 7B:
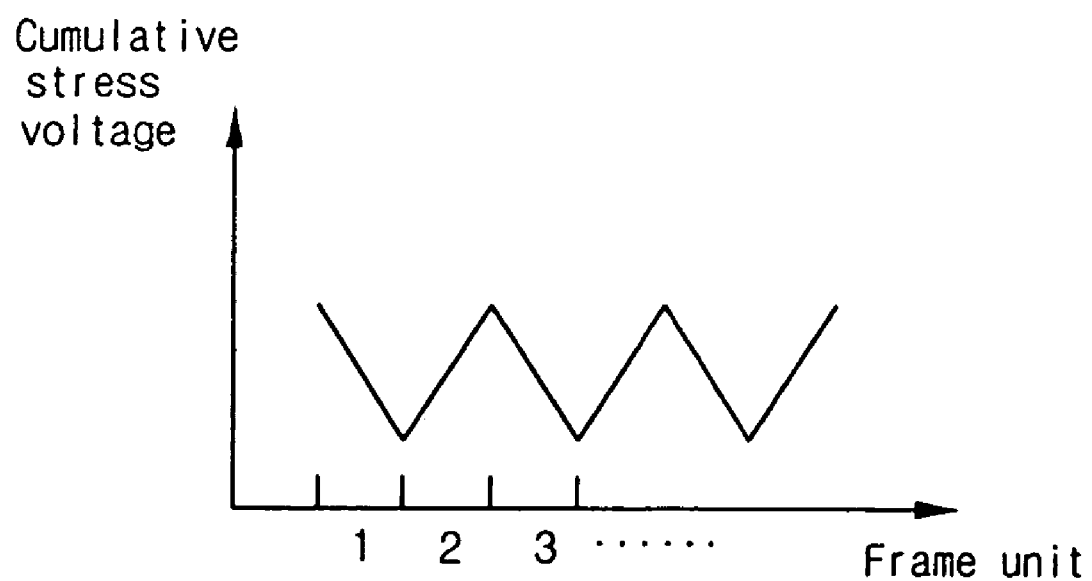

FIGS. 7A and 7B are graphs illustrating the cumulative stress voltages in the shift register of FIG. 5. Referring to FIG. 7A, the cumulative stress voltage of the node QBO increases as the high-state voltage of 20 V is charged in the first frame. The cumulative stress voltage of the node QBO decreases as the idle voltage of −20 V is charged in the second frame. The cumulative stress voltage of the node QBO again increases as the high-state voltage of 20 V is supplied in the third frame. Also, the cumulative stress voltage of the node QBO again decreases as the idle voltage of −20 V is supplied in the fourth frame. Through the repetition of the above operations over a series of frames, an average value of the cumulative stress voltage becomes zero.

Referring to FIG. 7B, the cumulative stress voltage of the node QBE decreases as the idle voltage of −20 V is applied in the first frame. The cumulative stress voltage of the node QBE increases as the high-state voltage of 20 V is applied in the second frame. The cumulative stress voltage of the node QBE again decreases as the idle voltage of −20 V is applied in the third frame. Also, the cumulative stress voltage of the node QBE again increases as the high-state voltage of 20 V is applied in the fourth frame. However, the repetition of the above operations over a series of frames results in an average value of the cumulative stress voltages to be zero. Accordingly, since the average value of the cumulative stress voltages becomes zero at both the nodes QBO and QBE, degradation does not occur in the tenth and eleventh transistors coupled to the nodes QBO and QBE.

Figure 8A:
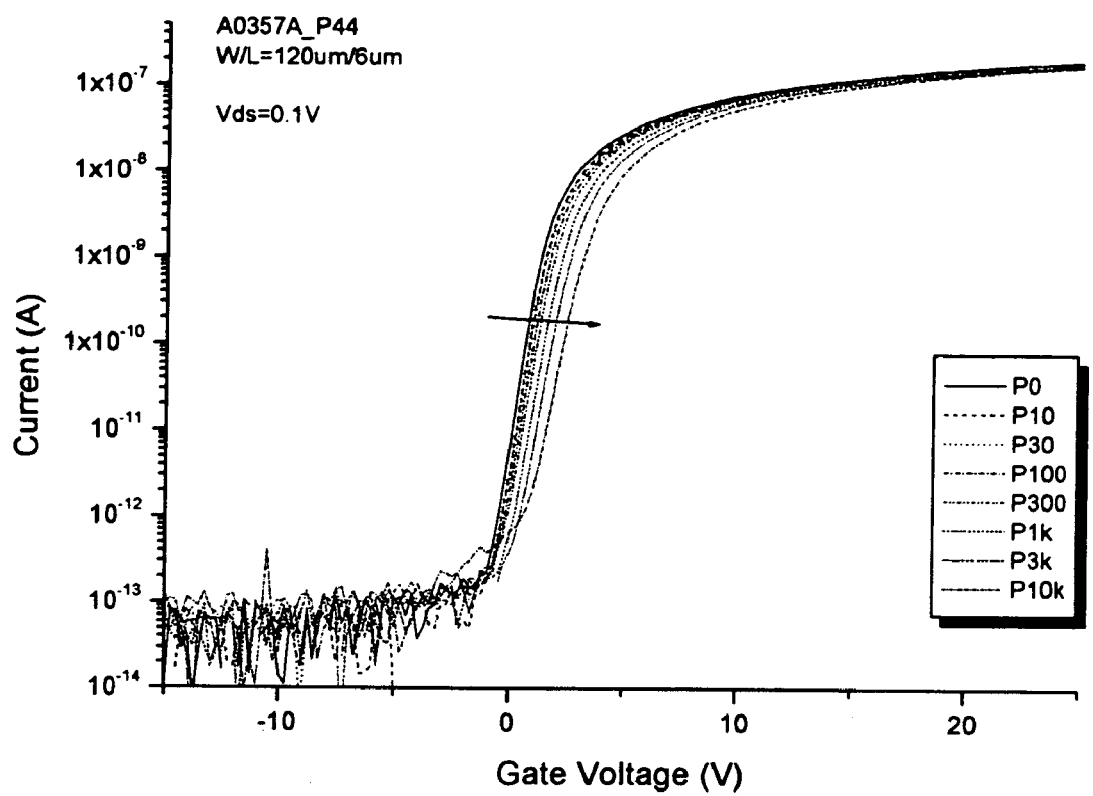
FIGS. 8A and 8B are graphs illustrating movement of a threshold voltage due to a constant DC voltage in the shift register of FIG. 5.
Figure 8B:
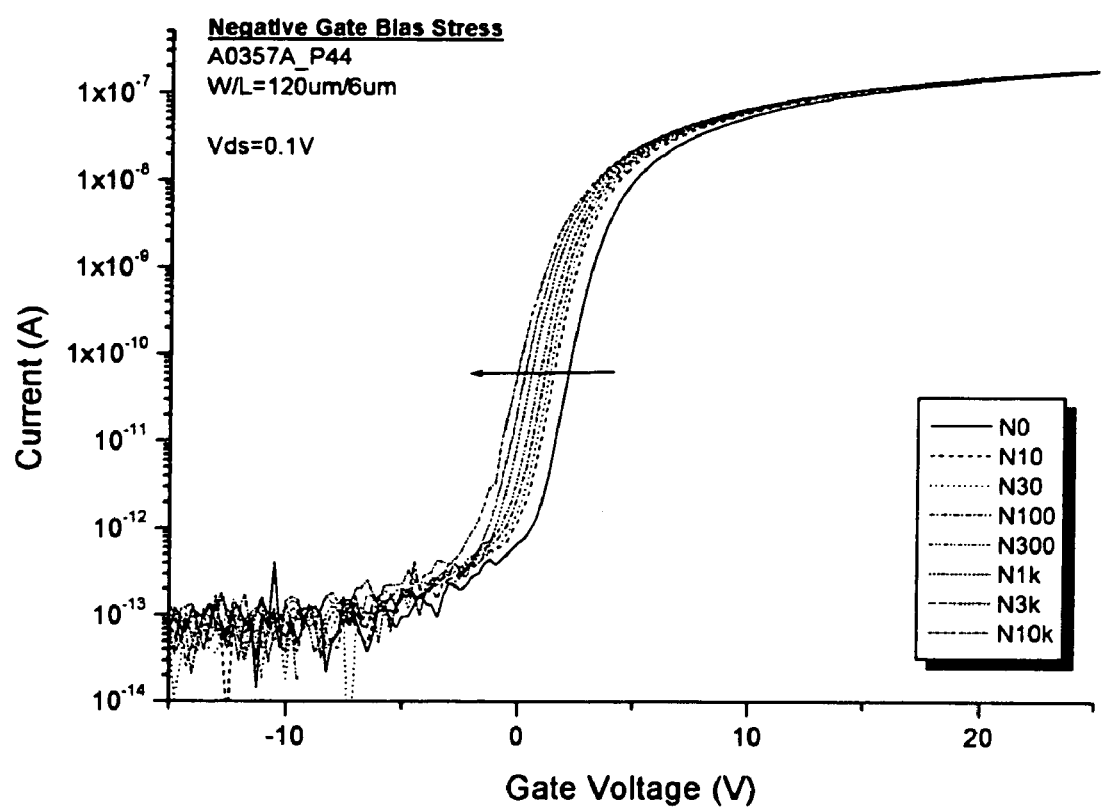

FIGS. 8A and 8B are graphs illustrating movement of a threshold voltage due to a constant DC voltage in the shift register of FIG. 5. In detail, FIG. 8A is a graph illustrating a movement of the threshold voltage when the high-state voltage is continuously supplied to one of the nodes QBO and QBE with respect to time. Further, FIG. 8B is a graph illustrating a movement of the threshold voltage when the idle voltage is continuously supplied to one of the nodes QBO and QBE with respect to time.

Referring to FIG. 8A, the threshold voltage increases over time when the high-state voltage is continuously applied. Referring to FIG. 8B, the threshold voltage decreases over time when the idle voltage is continuously applied. As can be seen from FIGS. 8A and 8B, if the single-polarity DC voltage (one of the high-state voltage or the idle voltage) is continuously supplied to one of the nodes QBO and QBE, the threshold voltage increases or decreases, so that the transistor will have an inconsistent threshold voltage such that the transistor operates unstably. To prevent the variation of the threshold voltage when a single-polarity DC voltage is used, the high-state voltage and the idle voltage are periodically inverted and are applied to the nodes QBO and QBE. Thus, the threshold voltage does not vary such that the operation of the transistor is stabilized and thus picture quality is improved.

Meanwhile, the shift register according to the first embodiment of the present invention can further include an additional transistor to prevent the current from flowing backward to one of the nodes QBO and QBE through the sixth and eighth transistors T6 and T8. This phenomenon occurs because the first supply voltage VSS becomes higher than the idle voltage when the idle voltage is supplied to one of the nodes QBO and QBE. The shift register having the additional transistor will be described with reference to FIG. 9.

FIG. 9 is a circuit diagram illustrating a shift register of a gate driver in an LCD according to a second embodiment of the present invention. Referring to FIG. 9, a first control part 21 and an output part 25 are similar to those shown in FIG. 5. Only the second control part 23 is different from the second control part of FIG. 5. Therefore, the following description will be made centering on the second control part 23.

The second control part 23 controls the nodes QBO and QBE to output the first supply voltage VSS through a tenth or eleventh transistor T10 or T11 of the output part 25. The first supply voltage VSS is supplied as the output voltage Vg1 at a low-state voltage through the first gate line GL1. For this purpose, the second control part 23 includes: a fifth transistor T5 coupled to a second supply voltage (VDD1) input line 36, a third clock signal (C3) input line 33, and the node QBO; a sixth transistor T6 coupled to the node QBO, a start pulse (SP) input line 35, and a first supply voltage (VSS) input line 38; a twelfth transistor T12 coupled between the fifth transistor T5 and the sixth transistor T6; a seventh transistor T7 coupled to a third supply voltage (VDD2) input line 37, the third clock signal (C3) input line 33, and the node QBE; and an eighth transistor T8 coupled to the node QBE, the start pulse (SP) input line 35, and the first supply voltage (VSS) input line 38; and a thirteenth transistor T13 coupled between the seventh transistor T7 and the eighth transistor T8

When the fourth, first, and second clock signals C4, C1, and C2 become a high-state voltage, the first supply voltage VSS is supplied to the nodes QBO and QBE. Also, when the third clock signal C3 becomes a high-state voltage, opposite voltages VDD1 and VDD2 are supplied to the nodes QBO and QBE. Of course, the coupling of the respective clock signals coupled to the respective transistors, as shown in FIG. 9, is exemplary for the first shift register. When the respective clock signals are coupled to the respective transistors in a manner different than the case of FIG. 9, the nodes QBO and QBE can be supplied with voltages as described above. Consequently, the nodes QBO and QBE can be supplied with the first supply voltage VSS during three of the clock signals among the clock signals C1 to C4, and the nodes QBO and QBE can be supplied with an opposite voltage during one clock signal. For example, VDD1 becomes a positive high-state voltage (20 V) and VDD2 becomes a negative idle voltage (−20 V) in one frame. In a next frame, the voltages are oppositely supplied. For example, VDD1 becomes the idle voltage (−20 V) and VDD2 becomes the positive high-state voltage (20 V).

In the second control part 23, the first supply voltage VSS or the symmetrical voltages VDD1 and VDD2 may be supplied to the nodes QBO and QBE at the same time, depending on which one among the start pulse SP and the third clock signal C3 becomes a high-state voltage. That is, when the start pulse SP becomes a high-state voltage, the sixth and eighth transistors T6 and T8 are turned on at the same time and, therefore, the first supply voltage VSS is supplied the nodes QBO and QBE at the same time. On the contrary, when the third clock signal C3 becomes a high-state voltage, the fifth and seventh transistors T5 and T7 are turned on at the same time. Therefore, the second supply voltage VDD1 is the node QBO through the fifth transistor T5 and the third supply voltage VDD2 is supplied to the node QBE through the seventh transistor T7 at the same time. As described above, the second supply voltage VDD1 and the second supply voltage VDD2 have symmetrically opposite polarity voltages.

Assuming that the shift register is in the period of one frame, when the positive high-state voltage is supplied to the node QBO and the negative idle voltage is supplied to the node QBE in the first frame, the negative idle voltage is supplied to the node QBO and the positive high-state voltage is supplied to the node QBE in the second frame. In this manner, the second supply voltage VDD1 and the third supply voltage VDD2 supplied to the nodes QBO and QBE are inverted after every frame.

When one of the second and third supply voltages VDD1 and VDD2 supplies the idle voltage at the node QBO or QBE, the first supply voltage VSS flows backward through one of the sixth and eighth transistors T6 and T8 because the idle voltage of −20 V is lower than the first supply voltage VSS. Therefore, there is a probability that the first supply voltage VSS can be supplied to one of the nodes QBO and QBE. Accordingly, a voltage increases in as much as the first supply voltage VSS is supplied to the node QBO or QBE where the negative idle voltage is supposed to be supplied. As a result, cumulative stress voltage may be increased.

In order to prevent the increase of cumulative stress voltage, the second control part 23 of the shift register according to the second embodiment of the present invention further includes the twelfth transistor T12 coupled between the fifth transistor T5 and the sixth transistor T6, and the thirteenth transistor T13 coupled between the seventh transistor T7 and the eighth transistor T8. The twelfth and thirteenth transistors T12 and T13 have a reverse diode function. Therefore, when the negative idle voltage is supplied to one of the nodes QBO and QBE, the twelfth or thirteenth transistors T12 and T13 can prevent the first supply voltage VSS from flowing backward. Waveforms at the nodes Q, QBO, and QBE and the output signal Vg1 are like those in FIG. 6.

Figure 10:
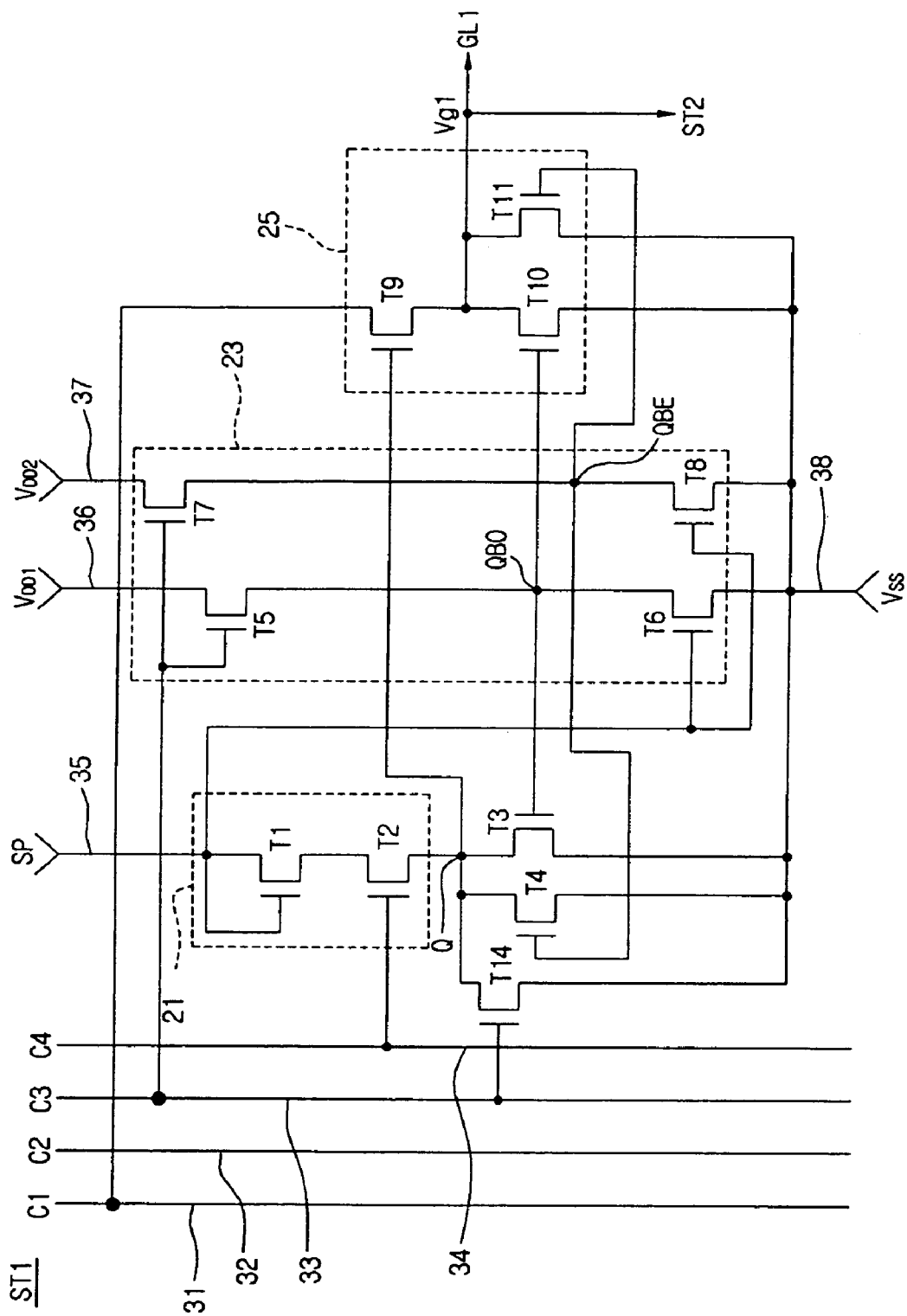
FIG. 10 is a circuit diagram illustrating a shift register of a gate driver in an LCD according to a third embodiment of the present invention.

FIG. 10 is a circuit diagram illustrating a shift register of a gate driver in an LCD according to a third embodiment of the present invention. Referring to FIG. 10, a shift register includes a first control part 21, a second control part 23, and an output part 25 like those of FIG. 5. However, a shift register according to a third embodiment of the present invention further includes a fourteenth transistor T14 coupled to the node Q, the third clock signal (C3) input line 33, and the first supply voltage (VSS) input line 38. The fourteenth transistor T14 controls the node Q in a dual operation with the ninth transistor T9.

An operation of the shift register including the fourteenth transistor T14 will be described below with reference to the voltage waveform of FIG. 6. First, during the first period, if the start pulse SP and the fourth clock signal C4 become a high-state voltage, the first and second transistors T1 and T2 are turned on. Thus, the high-state voltage of 20 V is supplied to the node Q. Due to the high-state voltage supplied to the node Q, the ninth transistor T9 is turned on so that the first clock signal C1 at a low-state is supplied to the first gate line GL1. Also, the sixth and eighth transistors T6 and T8 are turned on in response to the high-state voltage start pulse SP at the same time, so that the first supply voltage VSS at a low-state voltage is supplied to the nodes QBO and QBE at the same time. The third and fourth transistors T3 and T4 and the tenth and eleventh transistors T10 and T11 are turned off in response to the first supply voltage VSS at a low-state voltage at the same time.

During the second period, if the first clock signal C1 becomes a high-state voltage, then a higher high-state voltage of 40 V is supplied to the node Q due to the bootstrapping so that the ninth transistor T9 is completely turned on. Thus, the first clock signal C1 of a high-state voltage is output to the first gate line GL1 through the ninth transistor T9.

During the third period, if the second clock signal C2 becomes a high-state voltage, then the voltage at the node Q is again dropped to a voltage of 20 V and the low-state voltage of the first clock signal C1 is supplied to the first gate line GL1 through the turned-on ninth transistor T9.

During the fourth period, if the third clock signal C3 becomes a high-state voltage, then the fifth and seventh transistors T5 and T7 are turned on at the same time. Thus, the second supply voltage VDD1 is supplied to the node QBO and the third supply voltage VDD2 is supplied to the node QBE. As described above, the second and third supply voltages VDD1 and VDD2 have symmetrical opposite polarity voltages (for example, the positive high-state voltage and the negative idle voltage).

Assuming that the second supply voltage VDD1 is the positive high-state voltage and the third supply voltage VDD2 is the negative idle voltage, the third and tenth transistors T3 and T10 are turned on due to the high-state voltage supplied to the node QBO at the same time. Due to the third transistor T3 being turned-on, the high-state voltage (20 V) supplied to the node Q due to the turned-on third transistor T3 is applied to the first supply voltage VSS as a low-state voltage. Also, the first supply voltage VSS is supplied to the first gate line GL1 as a low-state voltage due to the turned-on tenth transistor T10.

In this case, the time necessary for the high-state voltage supplied to the node Q to change to the first supply voltage VSS is delayed somewhat due to the characteristic of the node Q. In order to reduce the time delay occurring at the node Q, the third embodiment further includes the fourteenth transistor T14. That is, if the third clock signal C3 becomes a high-state voltage in the fourth period, the fifth and seventh transistors T5 and T7 are turned on at the same time and the fourteenth transistor T14 is also turned on in response to the third clock signal C3.

Then, the second supply voltage VDD1 at a high-state voltage is supplied to the node QBO due to the turned-on fifth transistor T5, and the third and tenth transistors T3 and T10 are turned on in response to the second supply voltage VDD1 at a high-state voltage at the same time. At this time, the first supply voltage VSS of a low-state voltage is supplied to the node Q due to the third transistor T3. Also, the first supply voltage VSS at a low-state voltage is supplied to the node Q through the turned-on fourteenth transistor T14. In this case, the first supply voltage VSS can be supplied faster to the node Q through the fourteenth transistor T14 rather than the third transistor T3. That is, in order for the first supply voltage VSS to be supplied to the node Q through the third transistor T3, the second supply voltage VDD1 at a high-state voltage must be supplied to the node QBO. However, due to the characteristic of the node QBO, a predetermined time delay is required in order for the second supply voltage VDD1 at a high-state voltage is supplied to the node QBO. Therefore, when the third clock signal C3 becomes a high-state voltage, the fourteenth transistor T14 is immediately turned on and therefore the first supply voltage VSS can be rapidly supplied to the node Q through the fourteenth transistor T14. As a result, the time necessary to supply the first supply voltage VSS to the node Q is reduced, thereby achieving high-speed operation of the LCD.

Waveforms at the nodes Q, QBO, and QBE and the output signal Vg1 are like those shown in FIG. 6. Meanwhile, in addition to the node Q and the third clock signal (C3) input line 33, a fourth supply voltage (VSS_neg) input line is coupled to the fourteenth transistor T14, such that a pulse voltage (about −30 V) (that is, the fourth supply voltage VSS_neg) lower than at least the first supply voltage VSS is supplied at an arbitrary time point of a vertical blank time at the front porch and back porch. By turning on the fourteenth transistor T14 in response to the third clock signal C3, the pulse voltage Vss neg lower than at least the first supply voltage VSS can be supplied to the node Q.

Figure 11:
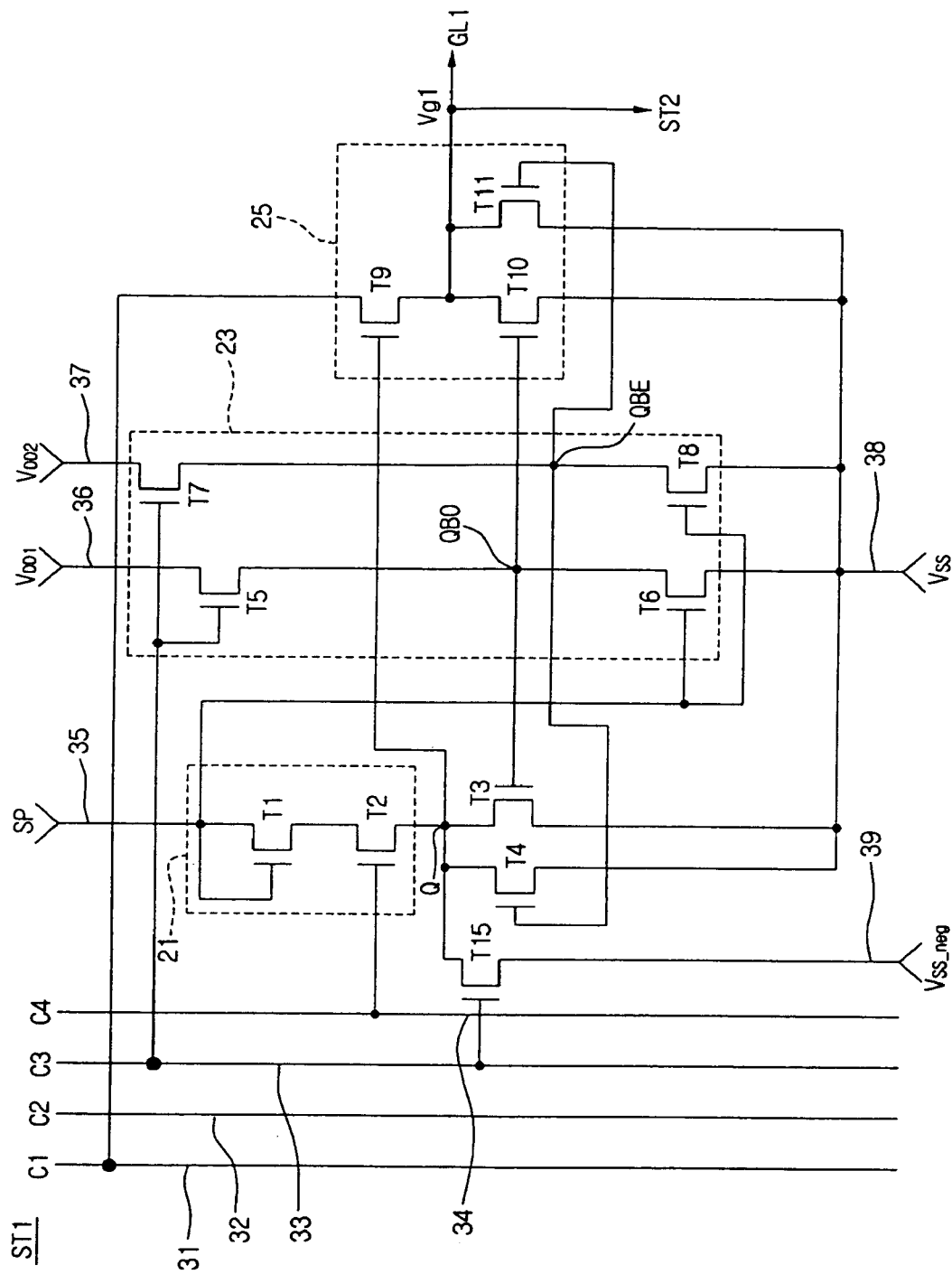
FIG. 11 is a circuit diagram illustrating a shift register of a gate driver in an LCD according to a fourth embodiment of the present invention.

FIG. 11 is a circuit diagram illustrating a shift register of a gate driver in an LCD according to a fourth embodiment of the present invention. While the fourteenth transistor T14 of FIG. 10 is coupled to the first supply voltage (VSS) input line 38, a fifteenth transistor T15 of FIG. 11 is coupled to an additional fourth supply voltage (VSS_neg) input line 39, not the first supply voltage (VSS) input line 38.

At this time, the fourth supply voltage VSS_neg has the same voltage (−5 V) as the first supply voltage VSS during the frames and has the pulse voltage (for example, −30 V) lower than at least the first supply voltage VSS at an arbitrary time point of the vertical blank time at the front porch and back porch. According to the regulation, a predetermined vertical blank time exists at the front porch and at the back porch. During such a vertical blank time, an image is not displayed on a screen. Nevertheless, the four-phase clock signals C1 to C4 are sequentially becoming a high-state voltage in turn.

In the fourth embodiment, when the third clock signal C3 becomes a high-state voltage during the vertical blank time, the fifteenth transistor T15 is turned on so that the pulse voltage (−30 V) lower than the first supply voltage VSS is supplied to the node Q from the fourth supply voltage (VSS_neg) input line 39. In this manner, a voltage of −30 V is supplied to the gate of the ninth transistor T9 coupled to the node Q, thereby preventing degradation which may occur at the ninth transistor T9. That is, the higher high-state voltage (20 V) is supplied to the node Q during the first to third periods and is changed to a first supply voltage VSS at a low-state voltage (−5 V) during the fourth period. At this time, while the stress voltage accumulated at the ninth transistor T9 increases greatly due to the higher high-state voltage (20 V) during the first to third periods, it increases more smoothly due to the low-state voltage (−5 V) during the fourth period. If these states are continued during every frame, an average of the total cumulative stress voltages due to the high-state voltage (20 V) and the low-state voltage (−5V) generally increases in one direction, thus increasing the probability that can cause degradation.

Like the fourth embodiment, instead of the first supply voltage VSS, the fourth supply voltage VSS_neg is lower than at least the first supply voltage VSS supplied to the node Q at an arbitrary time point of the vertical blank time. Therefore, an average of the gradually increasing total cumulative stress voltages is reduced, so that the stress voltage becomes constant. Consequently, degradation of the shift register can be prevented.

Waveforms at the nodes Q, QBO, and QBE and the output signal Vg1 are like those shown in FIG. 6. Since the start pulse SP and the fourth clock signal C4 have the phases synchronized with each other, the start pulse input line 35 and the fourth clock signal input line 34 can be exchanged with each other. That is, the start pulse (SP) input line 35 can be coupled to the second transistor T2 and the fourth clock signal input line 34 can be coupled to the first transistor T1. In any case, important is that the start pulse SP and the fourth clock signal C4 become high-state at the same time such that the first and second transistors T1 and T2 are turned on at the same time.

Although the four-phase clock signals C1 to C4 are used in the shift registers, three-phase clock signals C1 to C3 or more than four-phase clock signals can be used. For example, when three-phase clock signals C1 to C3 are used, the first clock signal input line 31 is coupled in the same manner as shown in FIG. 5. However, the fifth and seventh transistors T5 and T7 coupled to the third clock signal (C3) input line 33 are coupled to the second clock signal (C2) input line 32, and the second transistor T2 coupled to the fourth clock signal (C4) input line 34 is coupled to the third clock signal (C3) input line 33.

When the three-phase clock signals C1 to C3 are used, waveforms at the nodes Q, QBO, and QBE and the output signal Vg1 are like those shown in FIG. 6. However, if four-phase clock signals C1 to C4 are used, the low-state voltage is supplied to the node Q during the fourth period, the positive high-state voltage is supplied to the node QBO, and the negative idle voltage is supplied to the node QBE. On the other hand, if the three-phase clock signals C1 to C3 are used, the low-state voltage is supplied to the node Q during the third period, the positive high-state voltage is supplied to the node QBO, and the negative idle voltage is supplied to the node QBE. Also, if the three-phase clock signals C1 to C3 are used, the output signal Vg1 is outputted as the high-state voltage during the second period. Therefore, as described above, if the clock signals are modified from the four-phase clock signals C1 to C4 to the three-phase clock signals C1 to C3, the voltage variations (the node Q at which the low-state voltage is applied, the node QBO at which the high-state voltage is applied, the node QBE at which the idle voltage is applied, and then the output signal at a high-state voltage) are advanced by one clock.

If more than four-phase-clock signals are used, three-phase clock signals among the clock signals can be coupled to the corresponding transistors. When more than three-phase clock signals are used, it can be also seen that the voltage variations are advanced by one clock, based on the three-phase clock signals. At least three-phase clock signals are required so as to operate the shift register of the present invention.

According to the present invention, the two transistors T10 and T11 are provided to control the low-state voltage output signal of the shift register. The two transistors maintain the periodically inverted symmetrically opposite polarity voltages, thereby preventing the degradation of the shift register. Thus, it is possible to operate the shift register stably, to improve the picture quality, and to extend the life span of the device. Although the above description has been limited to the LCD, the shift register in embodiments of the present invention can be applied to organic light-emitting diode (OLED) devices and the like.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An active matrix display device comprising:
    a display panel having gate lines and data lines defining pixels;
    a gate driver in the display panel to supply output signals to gate lines of the display panel; and
    a data driver to supply image signals to data lines of the display panel,
    wherein the gate driver includes a plurality of shift registers to output signals that are sequentially shifted, each of the shift registers including:
    a first control part for controlling a first node in response to a first clock signal among a plurality of clock signals;
    a second control part for controlling second and third nodes in response to the start signal and a second clock signal; and
    an output part to selectively output one of a third clock signal and a first supply voltage in response to voltages of the first, second, and third nodes,
    whereby second and third supply voltages are changed in different levels in a period for application at the second and third nodes.

2. The active matrix display device according to claim 1, wherein the second and third supply voltages are symmetrically opposite polarity voltages.

3. The active matrix display device according to claim 1, wherein the second and third supply voltage are asymmetrically opposite polarity voltages.

4. The active matrix display device according to claim 1, wherein the first control part includes:
    a first transistor coupled to an input line of the start signal;
    a second transistor coupled to the first transistor, an input line of the first clock signal, and the first node for applying the start signal to the first node in response to the first clock signal;
    a third transistor coupled to the first node, the second node, and an input line of the first supply voltage for applying the first supply voltage to the first node; and
    a fourth transistor coupled to the first node, the third node, and an input line of the first supply voltage for applying the first supply voltage to the first node.

5. The active matrix display device according to claim 4, further including a fifth transistor coupled to the first node, an input line of the second clock signal, and the input line of the first supply voltage for rapidly changing the start signal supplied to the first node into the first supply voltage.

6. The active matrix display device according to claim 5, further including a fifth transistor coupled to the first node, an input line of the second clock signal, and an input line of a fourth supply voltage to apply a fourth supply voltage at the first node at either a front porch or a back porch.

7. The active matrix display device according to claim 1, wherein the first control part includes:
    a first transistor coupled to an input line of the first clock signal;
    a second transistor coupled to the first transistor, an input line of the start signal, and the first node to apply the first clock signal at the first node in response to the start signal;
    a third transistor coupled to the first node, the second node, and an input line of the first supply voltage to apply the first supply voltage to the first node; and
    a fourth transistor coupled to the first node, the third node, and an input line of the first supply voltage to apply the first supply voltage to the first node.

8. The active matrix display device according to claim 7, further including a fifth transistor coupled to the first node, an input line of the second clock signal, and an input line of the first supply voltage to rapidly change the start signal supplied to the first node into the first supply voltage.

9. The active matrix display device according to claim 7, further including a fifth transistor coupled to the first node, an input line of the second clock signal, and an input line of a fourth supply voltage to apply the fourth supply voltage to the first node at either a front porch or back porch.

10. The active matrix display device according to claim 1, wherein the second control part includes:
    a first transistor coupled to an input line of the second supply voltage, an input line of the second clock signal, and the second node to apply the second supply voltage at the second node in response to the second clock signal;

a second transistor coupled to the second node, an input line of the start signal, and an input line of the first supply voltage to apply the first supply voltage at the second node in response to the start signal;

a third transistor coupled to an input line of the third supply voltage, an input line of the second clock signal, and the third node to apply the third supply voltage at the third node in response to the second clock signal; and an fourth transistor coupled to the third node, an input line of the start signal, and an input line of the first supply voltage to apply the first supply voltage at the third node in response to the start signal.

11. The active matrix display device according to claim 10, further including a fifth transistor coupled between the second node and the second transistor to prevent the first supply voltage from flowing backward through the second transistor; and a sixth transistor coupled to the third node and the fourth transistor to prevent the first supply voltage from flowing backward through the fourth transistor.

12. The active matrix display device according to claim 1, wherein the output part includes:

a first transistor coupled between the first node and an input line of the third clock signal to output the third clock signal in response to a voltage at the first node;

a second transistor coupled to the first transistor, the second node, and an input line of the first supply voltage to output the first supply voltage in response to a voltage at the second node; and a third transistor coupled to the first transistor, the third node, and the input line of the first supply voltage to output the first supply voltage in response to a voltage at the third node.

13. An active matrix display device comprising:

a display panel having gate lines and data lines defining pixels;

a gate driver in the display panel to supply output signals to gate lines of the display panel; and a data driver to supply image signals to data lines of the display panel, wherein the gate driver includes a plurality of shift registers to output signals that are sequentially shifted, each of the shift registers including:

a first control part for controlling a first node in response to at least a first clock signal among a plurality of clock signals;

second control part for controlling first and second supply voltages from first voltage supply and a second voltage supply to a second node, respectively, and for controlling first and third supply voltages from a first voltage supply and a third voltage supply, respectively, to a third node in response to the start signal and a second clock signal;

output part to selectively output one of a third clock signal and a first supply voltage in response to the voltage of the first, second, and third nodes, whereby the second and third supply voltages are changed in different levels in a period for application at the second and third nodes.

14. The active matrix display device according to claim 13, wherein the first control part includes:

a first transistor coupled to an input line of the start signal;

a second transistor coupled to the first transistor, an input line of the first clock signal, and the first node for charging the start signal at the first node in response to the first clock signal;

a third transistor coupled to the first node, the second node, and an input line of the first supply voltage for applying the first supply voltage to the first node; and a fourth transistor coupled to the first node, the third node, and an input line of the first supply voltage for applying the first supply voltage to the first node.

15. The active matrix display device according to claim 14, further including a fifth transistor coupled to the first node, an input line of the second clock signal, and the input line of the first supply voltage for rapidly changing the start signal supplied to the first node into the first supply voltage.

16. The active matrix display device according to claim 14, further including a fifth transistor coupled to the first node, an input line of the second clock signal, and an input line of a fourth supply voltage to apply a fourth supply voltage at the first node at either a front porch or back porch.

17. The active matrix display device according to claim 13, wherein the first control part includes:

a first transistor coupled to an input line of the first clock signal;

a second transistor coupled to the first transistor, an input line of the start signal, and the first node to apply the first clock signal at the first node in response to the start signal;

a third transistor coupled to the first node, the second node, and an input line of the first supply voltage to apply the first supply voltage to the first node; and a fourth transistor coupled to the first node, the third node, and an input line of the first supply voltage to apply the first supply voltage to the first node.

18. The active matrix display device according to claim 17, further including a fifth transistor coupled to the first node, an input line of the second clock signal, and an input line of the first supply voltage to rapidly change the start signal supplied to the first node into the first supply voltage.

19. The active matrix display device according to claim 17, further including a fifth transistor coupled to the first node, an input line of the second clock signal, and an input line of a fourth supply voltage to apply the fourth supply voltage to the first node at either a front porch or back porch.

20. The active matrix display device according to claim 13, wherein the second control part includes:

a first transistor coupled to an input line of the second supply voltage, an input line of the second clock signal, and the second node to apply the second supply voltage at the second node in response to the second clock signal;

a second transistor coupled to the second node, an input line of the start signal, and an input line of the first supply voltage to apply the first supply voltage at the second node in response to the start signal;

a third transistor coupled to an input line of the third supply voltage, an input line of the second clock signal, and the third node to apply the third supply voltage at the third node in response to the second clock signal; and an fourth transistor coupled to the third node, an input line of the start signal, and an input line of the first supply voltage to apply the first supply voltage at the third node in response to the start signal.

21. The active matrix display device according to claim 20, further including a fifth transistor coupled between the second node and the second transistor to prevent the first supply voltage from flowing backward through the second transistor; and
a sixth transistor coupled to the third node and the fourth transistor to prevent the first supply voltage from flowing backward through the fourth transistor.

22. The active matrix display device according to claim 13, wherein the output part includes:
a first transistor coupled between the first node and an input line of the third clock signal to output a third clock signal in response to a voltage at the first node;
a second transistor coupled to the first transistor, the second node, and an input line of the first supply voltage to output the first supply voltage in response to a voltage at the second node; and
a third transistor coupled to the first transistor, the third node, and the input line of the first supply voltage to output the first supply voltage in response to a voltage at the third node.

23. A gate driver comprising:
a plurality of shift registers to output signals that are sequentially shifted in response to a start signal, each of the shift registers including:
a first control part for controlling a first node in response a first clock signal among a plurality of clock signals;
a second control part for controlling second and third nodes in response the start signal and a second clock signal; and
an output part to selectively output one of a third clock signal and a first supply voltage in response to voltages of the first, second, and third nodes,
whereby second and third supply voltages are changed in different levels in a period for application at the second and third nodes.

24. The gate driver according to claim 23, wherein the second and third supply voltages are symmetrically opposite polarity voltages.

25. The gate driver according to claim 23, wherein the second and third supply voltages are asymmetrically opposite polarity voltages.

26. The gate driver according to claim 23, wherein the first control part includes:
a first transistor coupled to an input line of the start signal;
a second transistor coupled to the first transistor, an input line of the first clock signal, and the first node for applying the start signal to the first node in response to the first clock signal;
a third transistor coupled to the first node, the second node, and an input line of the first supply voltage for applying the first supply voltage to the first node; and
a fourth transistor coupled to the first node, the third node, and an input line of the first supply voltage for applying the first supply voltage to the first node.

27. The gate driver according to claim 26, further including a fifth transistor coupled to the first node, an input line of the second clock signal, and the input line of the first supply voltage for rapidly changing the start signal supplied to the first node into the first supply voltage.

28. The gate driver according to claim 26, further including a fifth transistor coupled to the first node, an input line of the second clock signal, and an input line of a fourth supply voltage to apply a fourth supply voltage at the first node at either a front porch or a back porch.

29. The gate driver according to claim 23, wherein the first control part includes:
a first transistor coupled to an input line of the first clock signal;
a second transistor coupled to the first transistor, an input line of the start signal, and the first node to apply the first clock signal at the first node in response to the start signal;
a third transistor coupled to the first node, the second node, and an input line of the first supply voltage to apply the first supply voltage to the first node; and
a fourth transistor coupled to the first node, the third node, and an input line of the first supply voltage to apply the first supply voltage to the first node.

30. The gate driver according to claim 29, further including a fifth transistor coupled to the first node, an input line of the second clock signal, and the input line of the first supply voltage for rapidly changing the start signal supplied to the first node into the first supply voltage.

31. The gate driver according to claim 20, further including a fifth transistor coupled to the first node, an input line of the second clock signal, and an input line of a fourth supply voltage to apply a fourth supply voltage at the first node at either a front porch or a back porch.

32. The gate driver according to claim 23, wherein the second control part includes:
a first transistor coupled to an input line of the second supply voltage, an input line of the second clock signal, and the second node to apply the second supply voltage at the second node in response to the second clock signal;
a second transistor coupled to the second node, an input line of the start signal, and an input line of the first supply voltage to apply the first supply voltage at the second node in response to the start signal;
a third transistor coupled to an input line of the third supply voltage, an input line of the second clock signal, and the third node to apply the third supply voltage at the third node in response to the second clock signal; and
an fourth transistor coupled to the third node, an input line of the start signal, and an input line of the first supply voltage to apply the first supply voltage at the third node in response to the start signal.

33. The gate driver according to claim 32, further including a fifth transistor coupled between the second node and the second transistor to prevent the first supply voltage from flowing backward through the second transistor; and a sixth transistor coupled to the third node and the fourth transistor to prevent the first supply voltage from flowing backward through the fourth transistor.

34. The gate driver according to claim 23, wherein the output part includes:
a first transistor coupled between the first node and an input line of the third clock signal to output the third clock signal in response to a voltage at the first node;
a second transistor coupled to the first transistor, the second node, and an input line of the first supply voltage to output the first supply voltage in response to a voltage at the second node; and
a third transistor coupled to the first transistor, the third node, and the input line of the first supply voltage to output the first supply voltage in response to a voltage at the third node.

35. A method of operating a gate driver having a first control part for controlling a first node in response a first clock signal among a plurality of clock signals, a second control part for controlling second and third nodes in response the start signal and a second clock signal, and an output part to selectively output one of a third clock signal and a first supply voltage in response to voltages of the first, second, and third nodes, comprising:

applying a second supply voltage to the second node;
applying a third supply voltage to the third node;
generating an output of one of the third clock signal and the first supply voltage in response to voltages of the first, second, and third nodes; and switching the second and third supply voltages to apply the second supply voltage to the third node and to apply the third supply voltage to the second node, whereby the second and third supply voltages are changed in different levels in a period for application at the second and third nodes.

* * * * *